US012683573B2

(12) United States Patent
Ogura

(10) Patent No.: US 12,683,573 B2
(45) Date of Patent: Jul. 14, 2026

(54) VIBRATOR DEVICE

(71) Applicant: SEIKO EPSON CORPORATION, Tokyo (JP)

(72) Inventor: Seiichiro Ogura, Minowa (JP)

(73) Assignee: SEIKO EPSON CORPORATION (JP)

( * ) Notice: Subject to any disclaimer, the term of this patent is extended or adjusted under 35 U.S.C. 154(b) by 840 days.

(21) Appl. No.: 18/099,995

(22) Filed: Jan. 23, 2023

(65) Prior Publication Data

US 2023/0238938 A1    Jul. 27, 2023

(30) Foreign Application Priority Data

Jan. 24, 2022    (JP) ................................. 2022-008517

(51) Int. Cl.
    *H03H 9/05*         (2006.01)
    *H03H 9/02*         (2006.01)
    (Continued)

(52) U.S. Cl.
    CPC ...... *H03H 9/02259* (2013.01); *H03H 9/0547* (2013.01); *H03H 9/132* (2013.01); *H03H 9/19* (2013.01); *H03H 9/215* (2013.01); *H03H 9/2452* (2013.01); *H03H 9/2489* (2013.01); *H03H 9/2494* (2013.01);
    (Continued)

(58) Field of Classification Search
    CPC .... H03H 9/02259; H03H 9/05; H03H 9/0538; H03H 9/0547; H03H 9/132; H03H 9/19; H03H 9/21; H03H 9/215; H03H 9/2447; H03H 9/2452; H03H 9/2457; H03H 9/2468; H03H 9/2473; H03H 9/2478;

H03H 9/2489; H03H 9/2494; H03H 2009/02291; H03H 2009/02299; H10N 30/302; H10N 30/304; H10N 30/306; H10N 30/20;
(Continued)

(56) References Cited

U.S. PATENT DOCUMENTS

2006/0091765 A1*  5/2006  Oouchi ..................... H03B 5/32
                                                         310/348
2008/0106172 A1*  5/2008  Tanaya ..................... H03H 9/19
                                                         310/344
(Continued)

FOREIGN PATENT DOCUMENTS

JP          2021-071370 A      5/2021

*Primary Examiner* — Levi Gannon
(74) *Attorney, Agent, or Firm* — Harness, Dickey & Pierce, P.L.C.

(57)          ABSTRACT

A vibrator device includes a vibrator element having a base part, and a detection arm and a drive arm as a plurality of vibrating arms extending in a B direction as a first direction from the base part, a base body, and a support substrate configured to support the vibrator element with respect to the base body, wherein the support substrate includes a base-body fixation part to be fixed to the base body, an element support part configured to support the base part of the vibrator element, and a beam part configured to couple the base-body fixation part and the element support part to each other, and the support substrate has a plurality of recessed parts corresponding to the plurality of vibrating arms in an area which is located at a side of a surface opposed to the vibrator element, and on which at least a part of the vibrating arms overlaps in a plan view.

7 Claims, 17 Drawing Sheets

(51) Int. Cl.

| | | |
|---|---|---|
| *H03H 9/13* | (2006.01) | |
| *H03H 9/19* | (2006.01) | |
| *H03H 9/215* | (2006.01) | |
| *H03H 9/24* | (2006.01) | |
| *H10N 30/20* | (2023.01) | |
| *H10N 30/88* | (2023.01) | |

(52) U.S. Cl.
CPC ......... *H10N 30/2042* (2023.02); *H10N 30/88* (2023.02); *H03H 2009/02299* (2013.01); *H03H 2009/02496* (2013.01)

(58) Field of Classification Search
CPC ........... H10N 30/2041; H10N 30/2042; H10N 30/80; H10N 30/88; H10N 30/883
See application file for complete search history.

(56) References Cited

U.S. PATENT DOCUMENTS

| | | | |
|---|---|---|---|
| 2010/0133958 A1* | 6/2010 | Umeki | H03H 9/21 |
| | | | 29/25.35 |
| 2012/0126664 A1* | 5/2012 | Ogura | G01C 19/5607 |
| | | | 29/25.35 |
| 2013/0192367 A1* | 8/2013 | Osawa | G01C 19/5733 |
| | | | 73/504.12 |
| 2013/0320812 A1* | 12/2013 | Yamaguchi | H10N 30/88 |
| | | | 310/348 |
| 2021/0135652 A1 | 5/2021 | Ogura | |
| 2021/0167754 A1* | 6/2021 | Inoue | H03H 9/1057 |
| 2021/0247187 A1* | 8/2021 | Soejima | H10N 30/306 |

* cited by examiner

*FIG. 1*

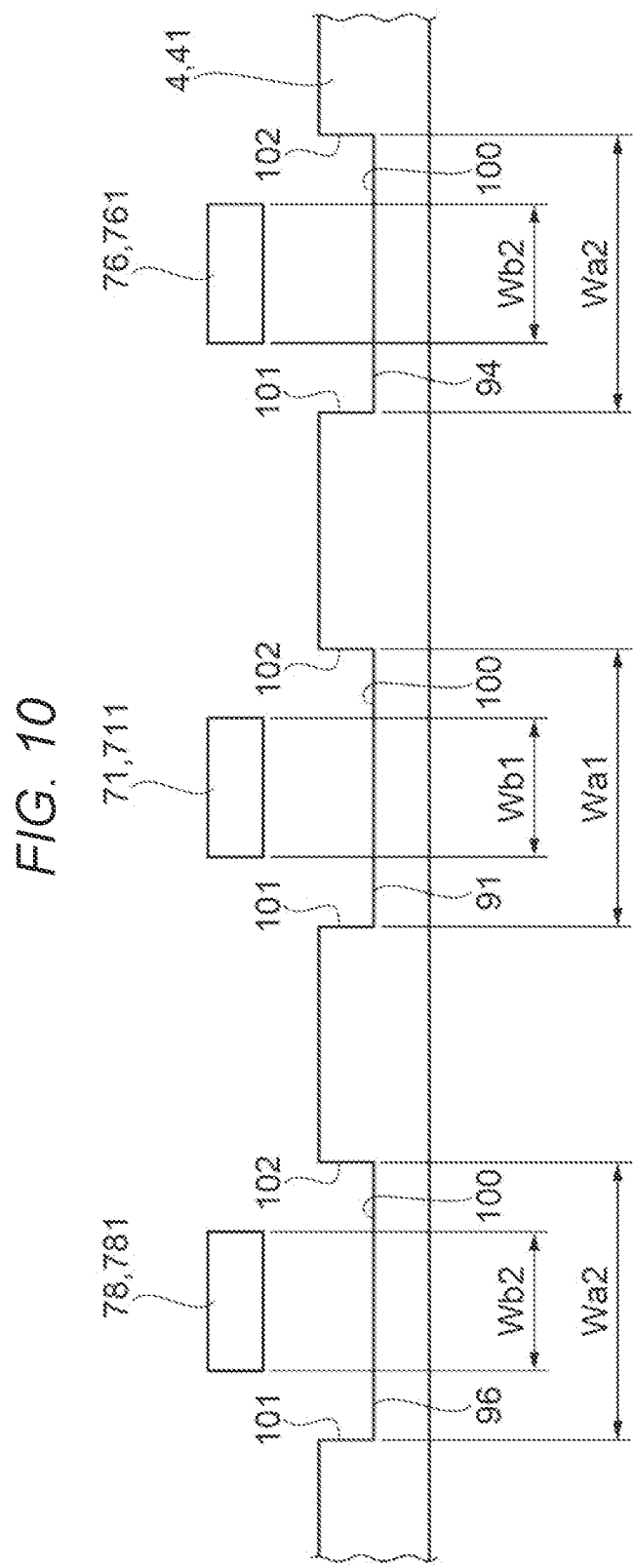
*FIG. 10*
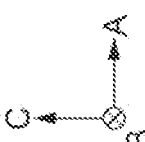

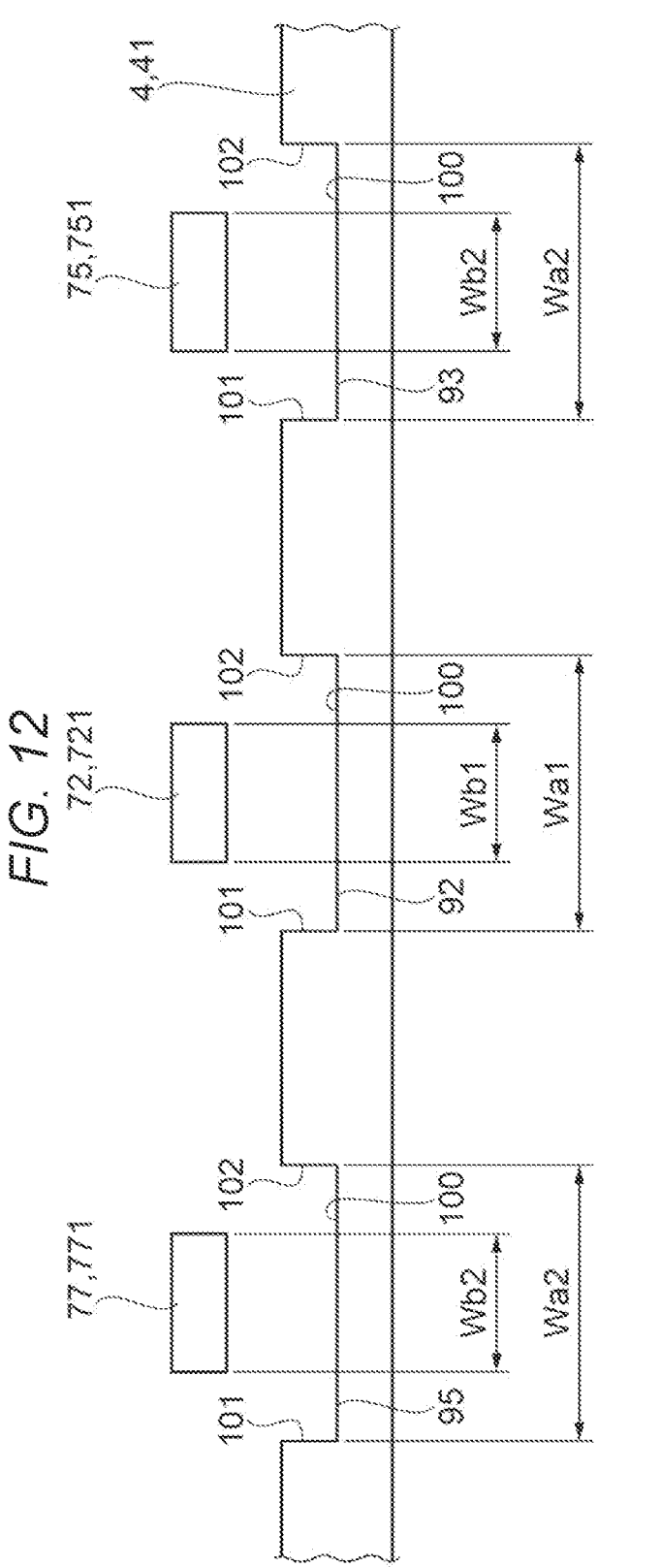
FIG. 12
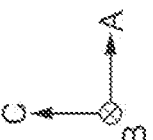

*FIG. 14*

VIBRATOR DEVICE

The present application is based on, and claims priority from JP Application Serial Number 2022-008517, filed Jan. 24, 2022, the disclosure of which is hereby incorporated by reference herein in its entirety.

BACKGROUND

1. Technical Field

The present disclosure relates to a vibrator device.

2. Related Art

In JP-A-2021-71370 (Document 1), there is described a vibrator device in which a support substrate is made to intervene between a base and a vibrator element to thereby fix the vibrator element to the base, wherein the support substrate has an element mounting part on which the vibrator element is mounted, a support part shaped like a frame located outside the element mounting part, and fixed to the base, and a beam part for coupling the element mounting part and the support part to each other, the vibrator element is fixed to an upper surface of the element mounting part, and the vibrator element and the support substrate are arranged so as to overlap each other in a plan view.

In the configuration of the vibrator device described in Document 1, a gap between the support substrate and the vibrator element in a thickness direction of the support substrate is small. Therefore, when the vibrator element is displaced due to an impact from the outside, the support substrate and the vibrator element are apt to make contact with each other. In particular, since the tip portion of the vibrating arm of the vibrator element is large in displacement, the tip portion of the vibrating arm and a support part of the support substrate are apt to make contact with each other. When the vibrating arm of the vibrating element makes contact with the support substrate, there is a possibility that the vibrating arm is damaged.

SUMMARY

A vibrator device includes a vibrator element having a base part, and a plurality of vibrating arms extending in a first direction from the base part, a base body, and a support substrate configured to support the vibrator element with respect to the base body, wherein the support substrate includes a base-body fixation part to be fixed to the base body, an element support part configured to support the base part of the vibrator element, and a beam part configured to couple the base-body fixation part and the element support part to each other, and the support substrate has a plurality of recessed parts corresponding to the plurality of vibrating arms in an area which is located at a side of a surface opposed to the vibrator element, and on which at least a part of the vibrating arms overlaps in a plan view.

BRIEF DESCRIPTION OF THE DRAWINGS

FIG. 1 is a cross-sectional view of a vibrator device according to Embodiment 1.

FIG. 10 is a cross-sectional view along the line N1-N1 in FIG. 9.

FIG. 12 is a cross-sectional view along the line N2-N2 in FIG. 11.

FIG. 14 is a plan view corresponding to a position of an M1 part of a vibrator device according to Embodiment 2.

DESCRIPTION OF EXEMPLARY EMBODIMENTS

Figure 2:
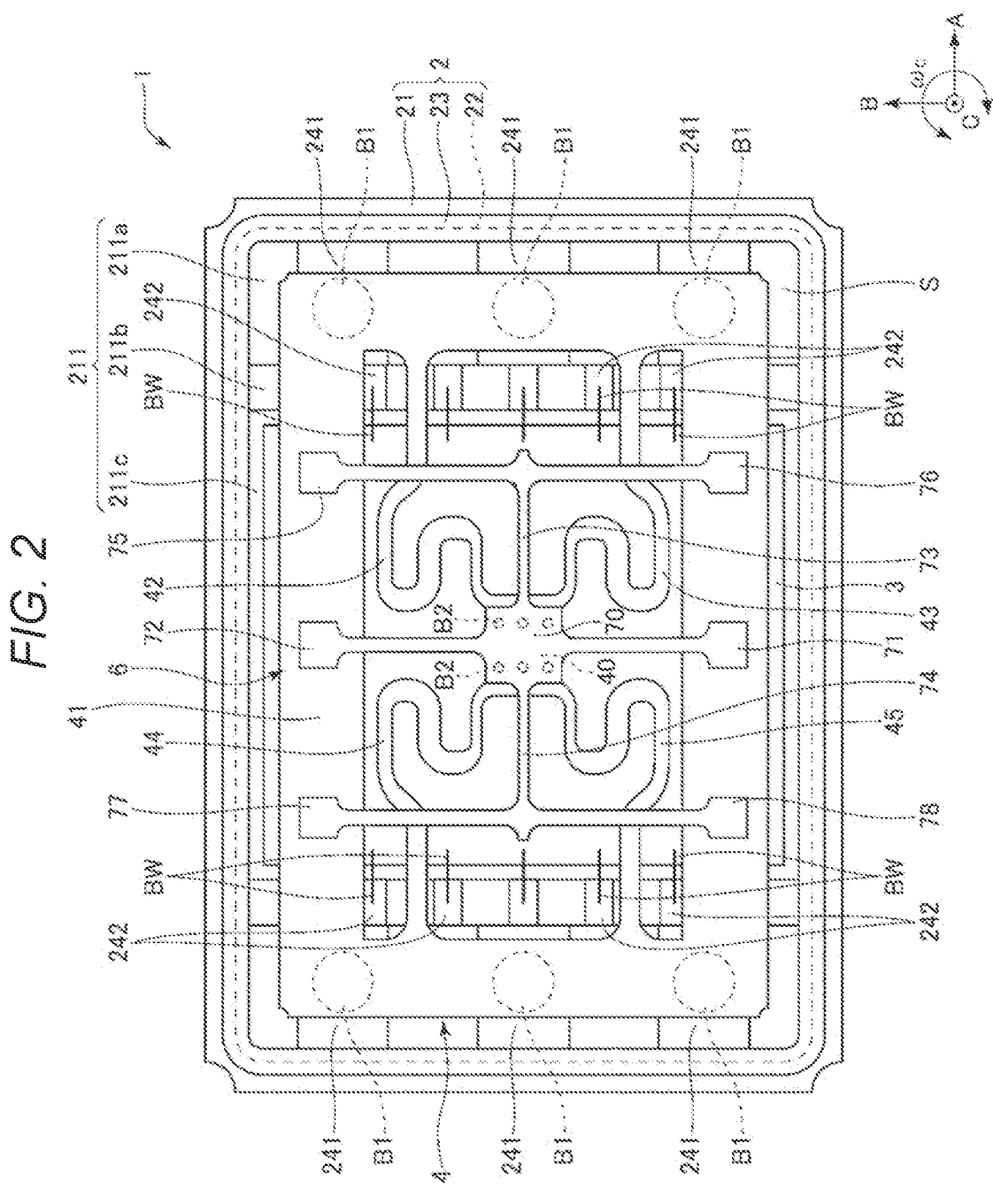
FIG. 2 is a plan view of the vibrator device according to Embodiment 1.

Then, some embodiments of the present disclosure will be described with reference to the drawings.

For the sake of convenience of explanation, an A axis, a B axis, and a C axis are illustrated as three axes perpendicular to each other in each of the drawings. A direction along the A axis is referred to as an "A direction," a direction along the B axis is referred to as a "B direction," and a direction along the C axis is referred to as a "C direction." Further, an arrow tip side of each of the axes is also referred to as a "positive side," and an arrow base-end side is also referred to as a "negative side." For example, the C direction means both directions, namely a C-direction positive side and a C-direction negative side. Further, the C-direction positive side is also referred to as an "upper side," and the C-direction negative side is also referred to as a "lower side." Further, a plan view from the C direction is also referred to simply as a "plan view." Further, the B direction is also referred to as a "first direction," the A direction is also referred to as a "second direction," and the C direction is also referred to as a "third direction."

1. Embodiment 1

A vibrator device 1 according to Embodiment 1 will be described with reference to FIG. 1 through FIG. 13.

Figure 1:
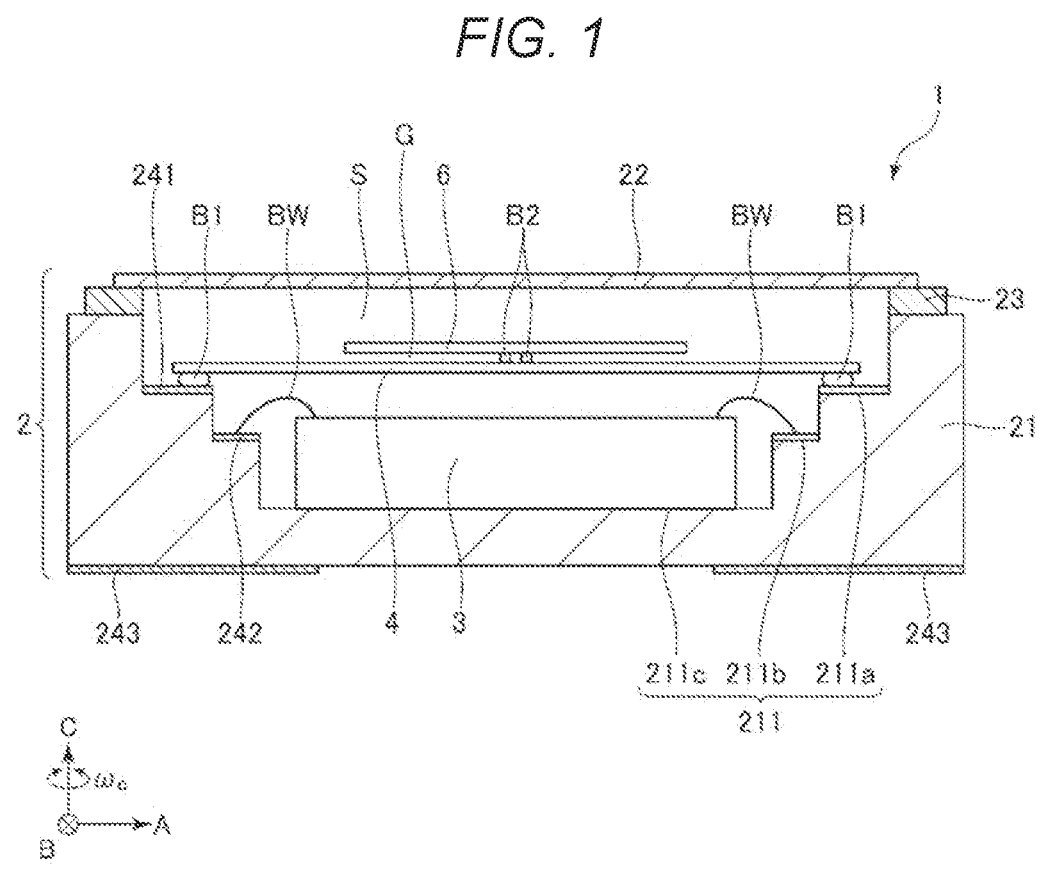

As shown in FIG. 1, the vibrator device 1 is a physical quantity sensor which has a detection axis set to the C axis to detect angular velocity ωc around the C axis. The vibrator device 1 has a package 2, a circuit element 3 housed in the package 2, a support substrate 4, and a vibrator element 6.

The package 2 has a base body 21 provided with a recessed part 211 opening on an upper surface, and a lid 22 as a lid body which closes the opening of the recessed part 211 and is bonded to the upper surface of the base body 21 via a bonding member 23. The recessed part 211 forms an internal space S inside the package 2, and the circuit element 3, the support substrate 4, and the vibrator element 6 are each housed in the internal space S. For example, the base body 21 can be formed of ceramics such as alumina, and the lid 22 can be formed of metal such as Kovar. It should be noted that the constituent materials of the base body 21 and the lid 22 are not particularly limited.

The internal space S is airtightly sealed, and is set in a reduced-pressure state, and preferably a state more approximate to a vacuum state. Thus, the viscosity resistance reduces and the vibration characteristics of the vibrator element 6 are improved. It should be noted that the atmosphere in the internal space S is not particularly limited, but can also be, for example, in the atmospheric pressure state or a pressurized state.

Further, the recessed part 211 is constituted by a plurality of recessed parts, and has a recessed part 211a, a recessed part 211b, and a recessed part 211c wherein the recessed part 211a opens on the upper surface of the base body 21, the recessed part 211b opens on a bottom surface of the recessed part 211a, and is smaller in opening width than the recessed part 211a, and the recessed part 211c opens on a bottom surface of the recessed part 211b, and is smaller in opening width than the recessed part 211b. Further, to the bottom surface of the recessed part 211a, there is fixed the support substrate 4 in a state of supporting the vibrator element 6, and to a bottom surface of the recessed part 211c, there is fixed the circuit element 3.

Further, in the internal space S, the vibrator element 6, the support substrate 4, and the circuit element 3 are arranged along the C direction.

In other words, as shown in FIG. 2, the vibrator element 6, the support substrate 4, and the circuit element 3 are arranged so as to overlap each other in a plan view. Thus, it is possible to suppress the planar spread towards the A direction and the B direction of the package 2, and thus, it is possible to achieve reduction in size of the vibrator device 1. Further, the support substrate 4 is located between the vibrator element 6 and the circuit element 3, and supports the vibrator element 6 from the lower side, namely the C-direction negative side.

Further, as shown in FIG. 1 and FIG. 2, on the bottom surface of the recessed part 211a, there is arranged a plurality of internal terminals 241, on the bottom surface of the recessed part 211b, there is arranged a plurality of internal terminals 242, and on the lower surface of the base body 21, there is arranged a plurality of external terminals 243. The internal terminals 241, 242 and the external terminals 243 are electrically coupled via interconnections not shown formed inside the base body 21. Further, the internal terminals 241 are electrically coupled to the vibrator element 6 via bonding members B1, B2 having electrical conductivity and the support substrate 4, and the internal terminals 242 are electrically coupled to the circuit element 3 via bonding wires BW.

The vibrator element 6 is an angular velocity sensor element which is a physical quantity sensor element capable of detecting the angular velocity ωc setting the C axis as the detection axis. In the present embodiment, the vibrator element 6 is a vibrator element having a so-called double-T structure.

Figure 3:
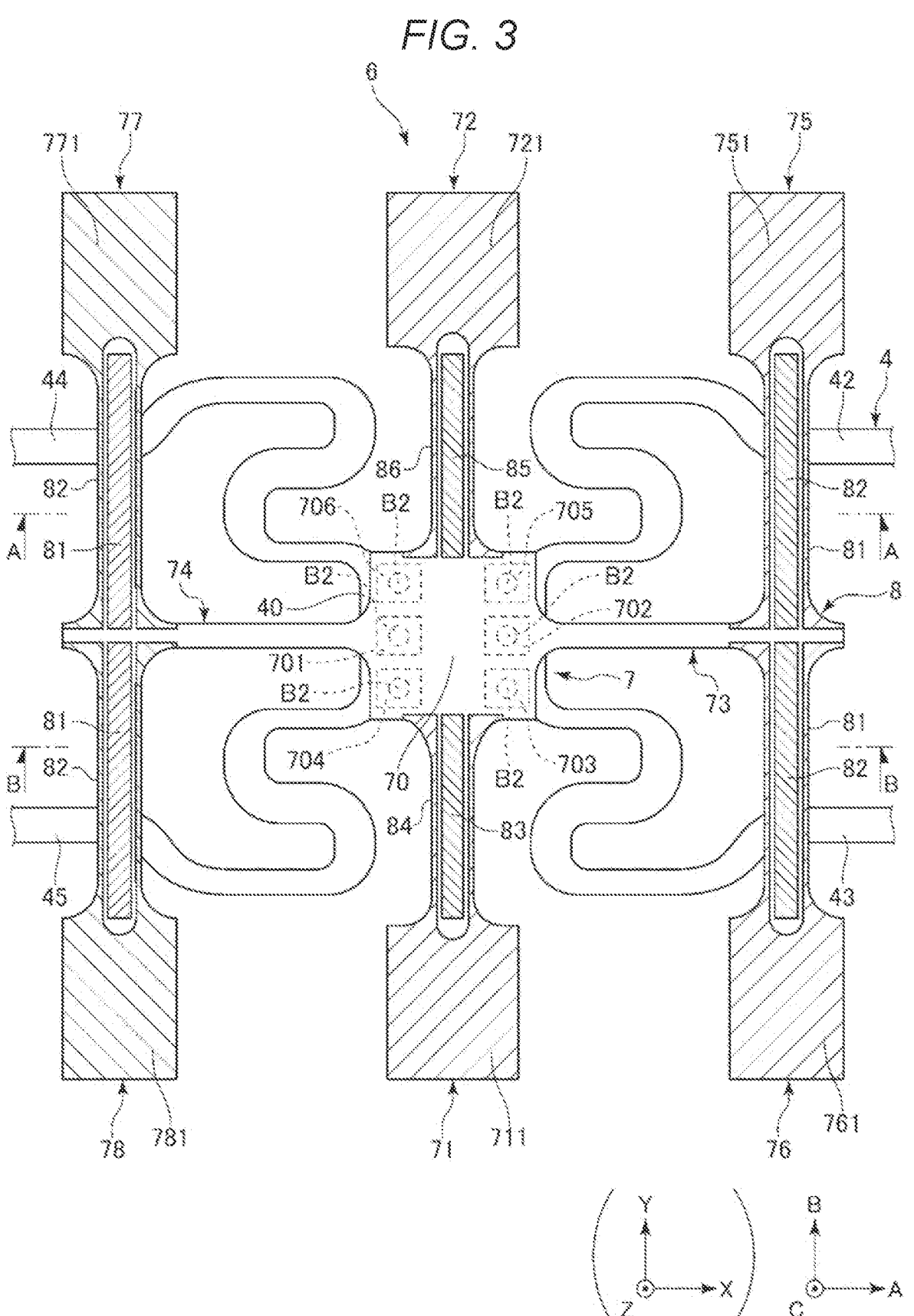
FIG. 3 is a plan view showing a vibrator element provided to the vibrator device according to Embodiment 1.

As shown in FIG. 3, the vibrator element 6 has a vibrating substrate 7, and electrodes 8 arranged on a surface of the vibrating substrate 7. The vibrating substrate 7 is formed of a Z-cut quartz crystal substrate. The Z-cut quartz crystal substrate has a spread in an X-Y plane defined by the X axis as an electrical axis and the Y axis as a mechanical axis, and has a thickness in a direction along the Z axis as an optical axis, the electrical axis, the mechanical axis, and the optical axis being the crystal axes of quartz crystal.

The vibrating substrate 7 has a base part 70, and a plurality of vibrating arms extending in the B direction as a first direction from the base part 70.

In particular, the vibrating substrate 7 has a base part 70 located in a central portion, detection arms 71, 72 as a pair of detection arms extending toward both sides in the B direction from the base part 70, a pair of coupling arms 73, 74 extending toward both sides in the A direction as a second direction from the base part 70, drive arms 75, 76 as a pair of vibrating arms extending toward both sides in the B direction from a tip portion of the coupling arm 73, and drive arms 77, 78 as a pair of vibrating arms extending toward both sides in the B direction from a tip portion of the coupling arm 74.

More particularly, the detection arm 71 extends toward the B-direction negative side from the base part 70, and the detection arm 72 extends toward the B-direction positive side from the base part 70. The coupling arm 73 extends toward the A-direction positive side from the base part 70, and the coupling arm 74 extends toward the A-direction negative side from the base part 70. The drive arm 75 extends toward the B-direction positive side from a tip portion of the coupling arm 73, and the drive arm 76 extends toward the B-direction negative side from the tip portion of the coupling arm 73. The drive arm 77 extends toward the B-direction positive side from a tip portion of the coupling arm 74, and the drive arm 78 extends toward the B-direction negative side from the tip portion of the coupling arm 74. The detection arm 71, the drive arm 76, and the drive arm 78 are arranged side by side along the A direction, and the detection arm 72, the drive arm 75, and the drive arm 77 are arranged side by side along the A direction.

It should be noted that in the detection arms 71, 72, portions where the detection arms 71, 72 are coupled to the base part 70 are also referred to as base-end portions of the detection arms 71, 72, respectively. The drive arms 75, 76, 77, and 78, portions where the drive arms 75, 76, 77, and 78 are coupled to the coupling arms 73, 74 are also referred to as base-end portions of the drive arms 75, 76, 77, and 78, respectively. The base-end portion side of each of the detection arms 71, 72 and the drive arms 75, 76, 77, and 78 is also referred to as the base part 70 side in the B direction in the detection arms 71, 72 and the drive arms 75, 76, 77, and 78.

By using the vibrating substrate 7 having such a shape, the vibrator element 6 having excellent vibration balance is obtained.

In tip portions of the detection arms 71, 72, there are disposed wide parts 711, 721 larger in width than the base-end portion, respectively. In tip portions of the drive arms 75, 76, 77, 78, there are disposed wide parts 751, 761, 771, and 781 larger in width than the base-end portion, respectively. It should be noted that the wide parts 711, 721, 751, 761, 771, and 781 are each referred to as a "hammerhead." By disposing the wide parts 711, 721, 751, 761, 771, and 781, when performing comparison at the same frequency, it is possible to shorten the detection arms 71, 72 and the drive arms 75, 76, 77, and 78, and thus, reduction in size of the vibrator element 6 can be achieved. Further, since the length of each of the drive arms 75, 76, 77, and 78 shortens, the viscosity resistance decreases, and the oscillation characteristics are improved. It should be noted that the configuration of the detection arms 71, 72 and the drive arms 75, 76, 77, and 78 is not particularly limited, and is not required to have, for example, the wide parts 711, 721, 751, 761, 771, and 781.

Figures 4, 5:
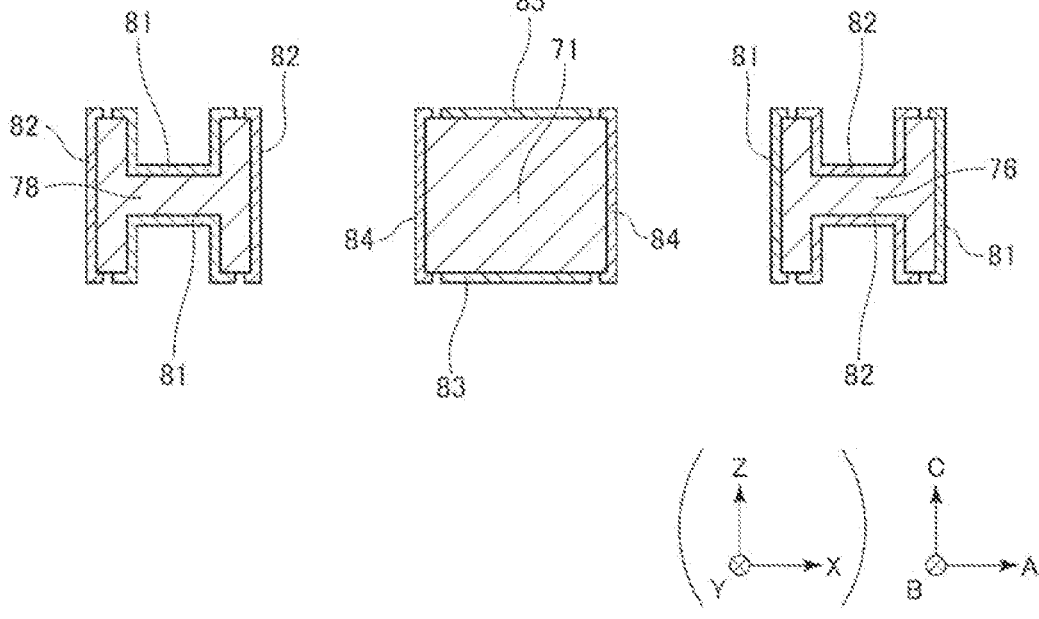
FIG. 4 is a cross-sectional view along the line A-A in FIG. 3.
FIG. 5 is a cross-sectional view along the line B-B in FIG. 3.

Further, as shown in FIG. 4 and FIG. 5, the drive arms 75, 76, 77, and 78 each have a groove opening on the upper surface and a groove opening on the lower surface to form a substantially H-shaped cross-sectional shape. It should be noted that regarding the detection arms 71, 72, it is possible to provide a groove opening on the upper surface and a groove opening on the lower surface to form a substantially H-shaped cross-sectional shape.

As shown in FIG. 3, FIG. 4, and FIG. 5, the electrodes 8 include a drive signal electrode 81, a drive ground electrode 82, a first detection signal electrode 83, a first detection ground electrode 84, a second detection signal electrode 85, and a second detection ground electrode 86. The drive ground electrode 82 is the ground for the drive signal electrode 81, the first detection ground electrode 84 is the ground for the first detection signal electrode 83, and the second detection ground electrode 86 is the ground for the second detection signal electrode 85.

The drive signal electrode 81 is disposed on both side surfaces of each of the drive arms 75, 76, and an upper surface and a lower surface of each of the drive arms 77, 78. Meanwhile, the drive ground electrode 82 is disposed on an upper surface and a lower surface of each of the drive arms 75, 76, and both side surfaces of each of the drive arms 77, 78. Further, the first detection signal electrode 83 is disposed on the upper surface and the lower surface of the detection arm 71, and the first detection ground electrode 84 is disposed on the both side surfaces of the detection arm 71. Meanwhile, the second detection signal electrode 85 is disposed on the upper surface and the lower surface of the detection arm 72, and the second detection ground electrode 86 is disposed on the both side surfaces of the detection arm 72.

Further, the drive signal electrode 81, the drive ground electrode 82, the first detection signal electrode 83, the first detection ground electrode 84, the second detection signal electrode 85, and the second detection ground electrode 86 are each pattered to the lower surface of the base part 70. Then, on the lower surface of the base part 70, there are disposed a terminal 701 electrically coupled to the drive signal electrode 81, a terminal 702 electrically coupled to the drive ground electrode 82, a terminal 703 electrically coupled to the first detection signal electrode 83, a terminal 704 electrically coupled to the first detection ground electrode 84, a terminal 705 electrically coupled to the second detection signal electrode 85, and a terminal 706 electrically coupled to the second detection ground electrode 86.

Such a vibrator element 6 detects the angular velocity ωc in the following manner.

Figure 6:
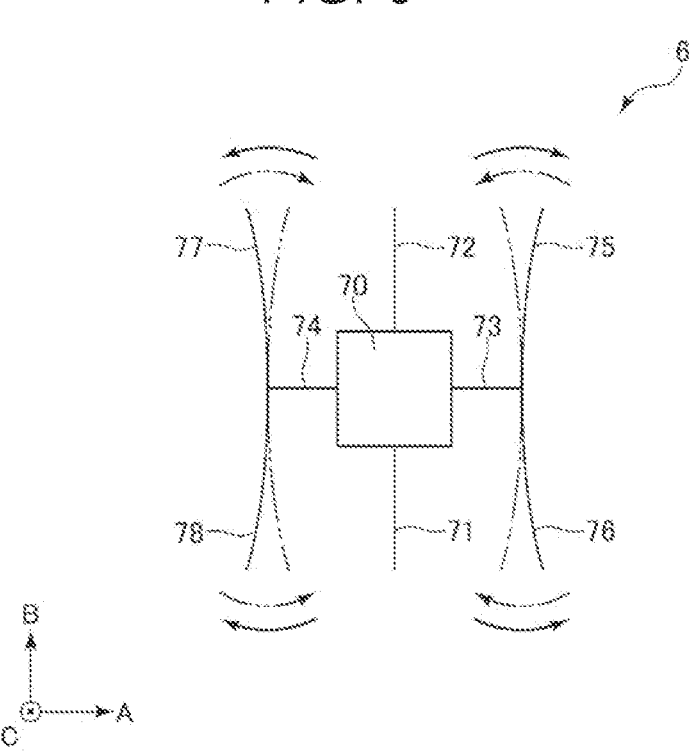
FIG. 6 is a schematic diagram for explaining drive of the vibrator element.
Figure 7:
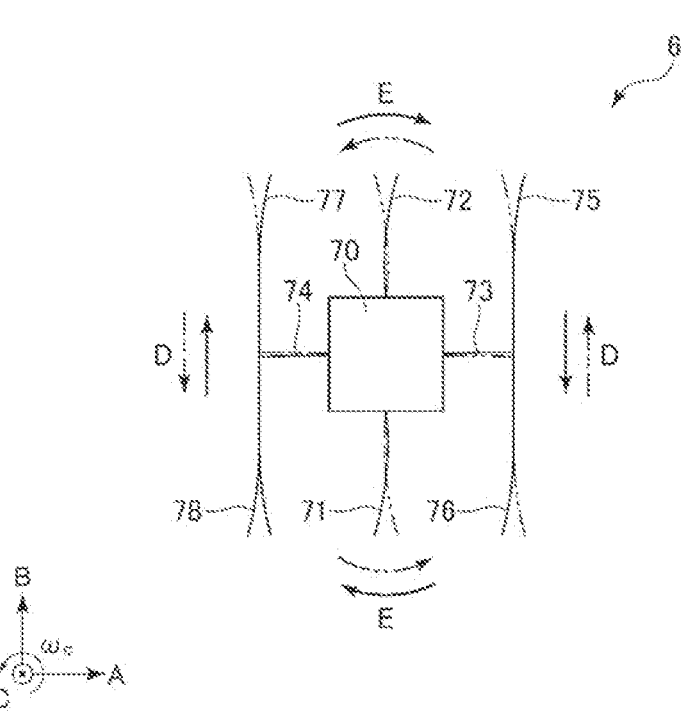
FIG. 7 is a schematic diagram for explaining drive of the vibrator element.

First, when applying a drive signal between the drive signal electrode 81 and the drive ground electrode 82, the drive arms 75, 76, 77, and 78 make a flexural vibration along an A-B plane defined by the A axis and the B axis as shown in FIG. 6. This drive mode is hereinafter referred to as a drive vibration mode. Further, when the angular velocity ωc is applied to the vibrator element 6 in the state of performing the drive in the drive vibration mode, a detection vibration mode shown in FIG. 7 is newly excited. In the detection vibration mode, a Coriolis force acts on the drive arms 75, 76, 77, and 78 to excite the vibration in a direction indicated by the arrow D, and in concert with this vibration, the detection vibration due to the flexural vibration occurs in a direction indicated by the arrow E in the detection arms 71, 72. A charge generated in the detection arm 71 due to such a detection vibration mode is taken out between the first detection signal electrode 83 and the first detection ground electrode 84 as a first detection signal, a charge generated in the detection arm 72 is taken out between the second detection signal electrode 85 and the second detection ground electrode 86 as a second detection signal, and thus, it is possible to detect the angular velocity ωc based on these first and second detection signals.

The circuit element 3 shown in FIG. 1 includes a drive circuit for driving the vibrator element 6, and a detection circuit for detecting the angular velocity ωc applied to the vibrator element 6. It should be noted that the circuit element 3 is not particularly limited, and can include another circuit such as a temperature compensation circuit.

Further, as shown in FIG. 2, the support substrate 4 includes an element support part 40, a base-body fixation part 41, and beam parts 42, 43, 44, and 45.

The element support part 40 supports the base part 70 of the vibrator element 6. In particular, the base part 70 of the vibrator element 6 is fixed to the element support part 40 via the bonding member B2.

The base-body fixation part 41 is shaped like a frame surrounding the element support part 40. The base-body fixation part 41 is fixed to the base body 21 of the package 2. In particular, the base-body fixation part 41 is fixed to a bottom surface of the recessed part 211*a* in the base body 21 via the bonding member B1.

The beam parts 42, 43, 44, and 45 couple the element support part 40 and the base-body fixation part 41 to each other. In particular, out of the beam pars 42, 43, 44, and 45, the pair of beam parts 42, 43 couple the element support part 40 and the base-body fixation part 41 to each other at the A-direction positive side of the element support part 40, and the pair of beam parts 44, 45 couple the element support part 40 and the base-body fixation part 41 to each other at the A-direction negative side of the element support part 40. In other words, the element support part 40 is supported by the beam parts 42, 43 and the beam parts 44, 45 from both sides of the element support part 40.

The beam parts 42, 43, 44, and 45 each have a portion meandering like an S shape in the middle thereof, and has a shape which easily makes an elastic deformation in the A direction and the B direction. By the beam parts 42, 43, 44, and 44 deforming in the A direction and the B direction, it is possible to effectively absorb or relax the stress propagating from the base body 21. It should be noted that the shapes of the beam parts 42, 43, 44, and 45 are each not particularly limited, and can be provided with, for example, a straight shape with the meandering portion omitted. Further, it is possible for at least one of the beam parts 42, 43, 44, and 45 to be different in shape from the others.

Further, the support substrate 4 is not limited to the configuration described above. For example, the support substrate 4 can be provided with a gimbal structure in which the element support part 40 and the base-body fixation part 41 are coupled to each other via a beam part capable of rotating around the A axis, and a beam part capable of rotating around the B axis.

By making the support substrate 4 intervene between the vibrator element 6 and the base body 21 as described above, it is possible to absorb or relax the stress transmitted from the base body 21 due to the support substrate 4, and thus, it becomes difficult for the stress to propagate to the vibrator element 6. Therefore, it is possible to effectively prevent the degradation and the fluctuation of the vibration characteristics of the vibrator element 6.

Further, the support substrate 4 is formed of a quartz crystal substrate. By forming the support substrate 4 from the quartz crystal substrate similarly to the vibrating substrate 7, it is possible to make the support substrate 4 and the vibrating substrate 7 equal in thermal expansion coefficient to each other. Therefore, the thermal stress caused by the difference in thermal expansion coefficient from each other does not substantially occur between the support substrate 4 and the vibrating substrate 7, and it becomes more difficult for the vibrator element 6 to be subjected to stress. Therefore, it is possible to more effectively prevent the degradation and the fluctuation of the vibration characteristics of the vibrator element 6.

In particular, the support substrate 4 is formed of a Z-cut quartz crystal substrate the same in cutting angle as the vibrating substrate 7, and a direction of the crystal axis of the support substrate 4 coincides with a direction of the crystal axis of the vibrating substrate 7. In other words, the support substrate 4 and the vibrating substrate 7 coincide with each other in the X axis, the Y axis, and the Z axis. Since the quartz crystal is different in thermal expansion coefficient between the X direction, the Y direction, and the Z direction, by making the support substrate 4 and the vibrating substrate 7 the same in cutting angle to uniform the directions of the crystal axes, it becomes more difficult for the thermal stress caused by the difference in thermal expansion coefficient from each other to occur between the support substrate 4 and the vibrating substrate 7. Therefore, it becomes more difficult for the vibrator element 6 to be subjected to the stress, and thus, it is possible to more effectively prevent the degradation and the fluctuation of the vibration characteristics of the vibrator element 6.

It should be noted that the support substrate 4 is not limited thereto, but can also be, for example, a quartz crystal substrate which is different in directions of the crystal axes from the vibrating substrate 7 although the same in cutting angle as the vibrating substrate 7. Further, the support substrate 4 can also be a quartz crystal substrate different in cutting angle from the vibrating substrate 7. Further, the support substrate 4 is not limited to the quartz crystal substrate, but can be a semiconductor substrate made of, for example, silicon (Si).

Further, the support substrate 4 is provided with a wiring pattern not shown. The wiring pattern to be provided to the support substrate 4 electrically couples the vibrator element 6 and the internal terminals 241 to each other.

In particular, the wiring pattern provided to the support substrate 4 is electrically coupled to the terminals 701, 702, 703, 704, 705, and 706 of the vibrator element 6 shown in FIG. 3 via the bonding members B2 having electrical conductivity. The wiring pattern provided to the support substrate 4 is electrically coupled to the internal terminals 241 shown in FIG. 1 and FIG. 2 via the bonding members B1 having electrical conductivity. In other words, the terminals 701, 702, 703, 704, 705, and 706 of the vibrator element 6 and the internal terminals 241 are electrically coupled to each other via the bonding members B2, the wiring pattern provided to the support substrate 4, and the bonding members B1.

It should be noted that the bonding members B1, B2 are not particularly limited as long as both of the electrical conductivity and a bonding property are provided. As the bonding members B1, B2, it is possible to use, for example, a variety of types of metal bumps such as gold bumps, silver bumps, copper bumps, or solder bumps, or an electrically-conductive adhesive having an electrically-conductive filler such as a silver filler dispersed in a variety of types of adhesives such as a polyimide type adhesive, an epoxy type adhesive, a silicone type adhesive, and an acrylic adhesive. When using the metal bumps as the bonding members B1, B2, it is possible to suppress generation of a gas from the bonding members B1, B2, and it is possible to effectively prevent a change in environment, in particular rise in pressure, of the internal space S. On the other hand, when using the electrically-conductive adhesive as the bonding members B1, B2, the bonding members B1, B2 become relatively soft, and it is possible to absorb or relax the stress propagated from the base body 21 also in the bonding members B1, B2.

In the present embodiment, the electrically-conductive adhesive is used as the bonding members B1, and the metal bumps are used as the bonding members B2. By using the electrically-conductive adhesive as the bonding members B1 for bonding the support substrate 4 and the base body 21 formed of respective materials different in type from each other, the thermal stress caused by a difference in thermal expansion coefficient therebetween can effectively be absorbed or relaxed by the bonding members B1. On the other hand, since the support substrate 4 and the vibrator element 6 are bonded to each other with six bonding members B2 disposed in a relatively small area, by using the metal bumps as the bonding members B2, wetting spread which occurs in the case of the electrically-conductive adhesive is prevented, and thus, it is possible to effectively prevent the bonding members B2 from making contact with each other.

Incidentally, as described above, in the vibrator device 1, the vibrator element 6 and the support substrate 4 are arranged side by side along the C direction. In other words, the vibrator element 6 and the support substrate 4 are arranged so as to overlap each other in the C direction.

As shown in FIG. 1, a gap G between the support substrate 4 and the vibrator element 6 is formed of the bonding member B2 for bonding the support substrate 4 and the vibrator element 6 to each other, and the gap G between the support substrate 4 and the vibrator element 6 is relatively small. Therefore, when the drive arms 75, 76, 77, and 78 and the detection arms 71, 72 bend toward the support substrate 4 due to, for example, an impact from the outside, the drive arms 75, 76, 77, and 78 and the detection arms 71, 72 are apt to make contact with the support substrate 4. When the drive arms 75, 76, 77, and 78 and the detection arms 71, 72 make contact with the support substrate 4, there is a possibility that the drive arms 75, 76, 77, and 78 and the detection arms 71, 72 are damaged. When the drive arms 75, 76, 77, and 78 and the detection arms 71, 72 are damaged, the vibration characteristics of the drive arms 75, 76, 77, and 78 and the detection arms 71, 72 deteriorate.

Figure 8:
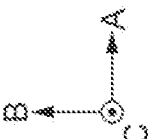
FIG. 8 is a plan view of a support substrate viewed from an upper side.

Therefore, in the present embodiment, the support substrate 4 has a plurality of recessed parts 91, 92, 93, 94, 95, and 96 as shown in FIG. 8. By the support substrate 4 having the recessed parts 91, 92, 93, 94, 95, and 96, it becomes difficult for the contact of the drive arms 75, 76, 77, and 78 and the detection arms 71, 72 with the support substrate 4 to occur, and thus, the damage of the drive arms 75, 76, 77, and 78 and the detection arms 71, 72 due to the contact is inhibited.

The recessed parts 91, 92, 93, 94, 95, and 96 provided to the support substrate 4 will hereinafter be described with reference to FIG. 8 through FIG. 13.

As shown in FIG. 8, the support substrate 4 has the recessed parts 91, 92, 93, 94, 95, and 96 corresponding respectively to the detection arms 71, 72 and the drive arms 75, 76, 77, and 78 in the areas which are located at a side of a surface opposed to the vibrator element 6, and which overlap the tip portions of the detection arms 71, 72 and the drive arms 75, 76, 77, and 78, respectively, in the plan view.

It should be noted that the detection arms 71, 72 are also referred to as first vibrating arms, and the drive arms 75, 76, 77, and 78 are also referred to as second vibrating arms. Further, the recessed parts 91, 92 disposed so as to correspond to the detection arms 71, 72 are also referred to as first recessed parts, and the recessed parts 93, 94, 95, and 96 disposed so as to correspond to the drive arms 75, 76, 77, and 78 are also referred to as second recessed parts.

In the present embodiment, the surface opposed to the vibrator element 6 in the support substrate 4 is an upper surface of the support substrate 4. In other words, the recessed parts 91, 92, 93, 94, 95, and 96 are disposed on an upper surface of the base-body fixation part 41. Further, the tip portions of the detection arms 71, 72 and the drive arms 75, 76, 77, and 78 overlap the base-body fixation part 41 of the support substrate 4 in the plan view. In other words, the recessed parts 91, 92, 93, 94, 95, and 96 are provided to the base-body fixation part 41.

In particular, the recessed part 91 is disposed in an area which is located on the upper surface of the base-body fixation part 41, and which overlaps the tip portion of the detection arm 71 in the plan view. In other words, the recessed part 91 is arranged so as to be opposed to the detection arm 71, and overlaps the tip portion of the detection arm 71 in the plan view.

The recessed part 92 is disposed in an area which is located on the upper surface of the base-body fixation part 41, and which overlaps the tip portion of the detection arm 72 in the plan view. In other words, the recessed part 92 is arranged so as to be opposed to the detection arm 72, and overlaps the tip portion of the detection arm 72 in the plan view.

The recessed part 93 is disposed in an area which is located on the upper surface of the base-body fixation part 41, and which overlaps the tip portion of the drive arm 75 in the plan view. In other words, the recessed part 93 is arranged so as to be opposed to the drive arm 75, and overlaps the tip portion of the drive arm 75 in the plan view.

The recessed part 94 is disposed in an area which is located on the upper surface of the base-body fixation part 41, and which overlaps the tip portion of the drive arm 76 in the plan view. In other words, the recessed part 94 is arranged so as to be opposed to the drive arm 76, and overlaps the tip portion of the drive arm 76 in the plan view.

The recessed part 95 is disposed in an area which is located on the upper surface of the base-body fixation part 41, and which overlaps the tip portion of the drive arm 77 in the plan view. In other words, the recessed part 95 is arranged so as to be opposed to the drive arm 77, and overlaps the tip portion of the drive arm 77 in the plan view.

The recessed part 96 is disposed in an area which is located on the upper surface of the base-body fixation part 41, and which overlaps the tip portion of the drive arm 78 in the plan view. In other words, the recessed part 96 is arranged so as to be opposed to the drive arm 78, and overlaps the tip portion of the drive arm 78 in the plan view.

Figure 9:
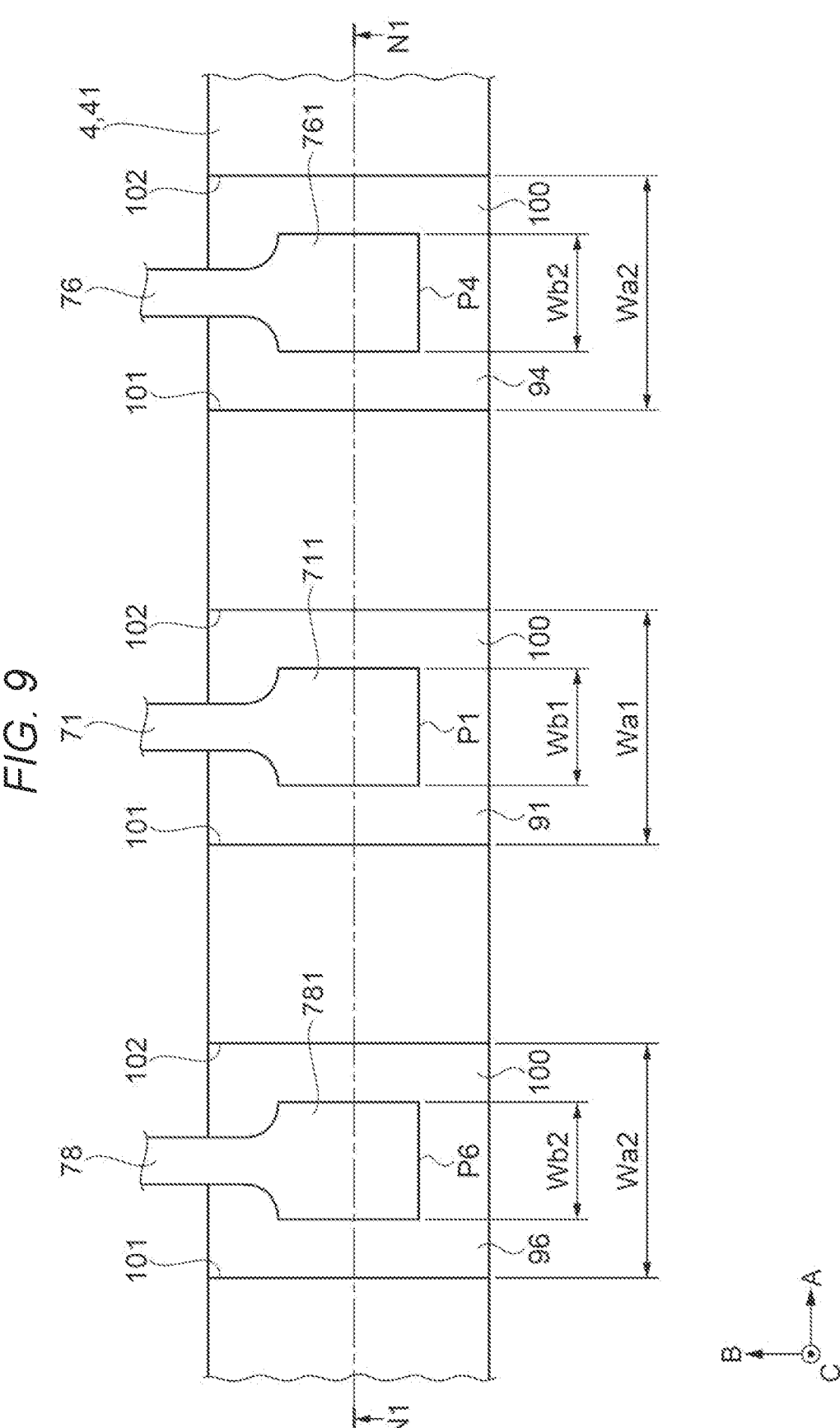
FIG. 9 is a plan view corresponding to a position of an M1 part in FIG. 8.
Figure 11:
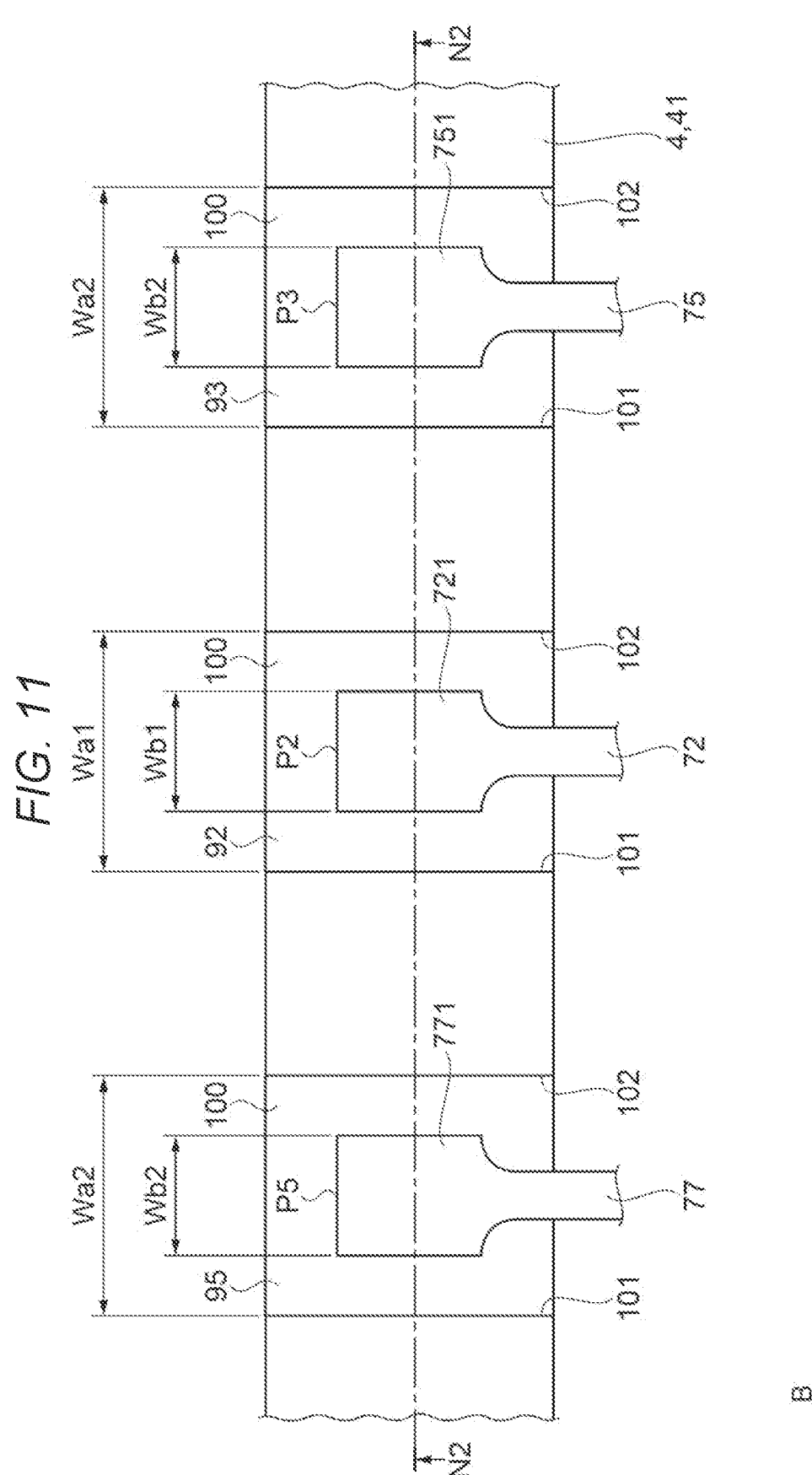
FIG. 11 is a plan view corresponding to a position of an M2 part in FIG. 8.

More particularly, as shown in FIG. 9 and FIG. 11, the recessed part 91 is disposed in an area overlapping an extreme tip portion P1 located at the farthest B-direction negative side of the detection arm 71 in the plan view. When the detection arm 71 bends in the C direction, the displacement in the C direction of the detection arm 71 becomes larger as proceeding toward the tip side of the detection arm 71. Specifically, when the detection arm 71 bends toward the support substrate 4, namely toward the C-direction negative side, the extreme tip portion P1 of the detection arm 71 is displaced with the largest displacement toward the support substrate 4, namely toward the C-direction negative side. Therefore, by arranging that the recessed part 91 and the extreme tip portion P1 of the detection arm 71 overlap each other, it becomes difficult for the contact between the detection arm 71 and the support substrate 4 to occur when the detection arm 71 bends toward the support substrate 4.

Similarly, the recessed part 92 is disposed in an area overlapping an extreme tip portion P2 located at the farthest B-direction positive side of the detection arm 72 in the plan view. The recessed part 93 is disposed in an area overlapping an extreme tip portion P3 located at the farthest B-direction positive side of the drive arm 75 in the plan view. The recessed part 94 is disposed in an area overlapping an extreme tip portion P4 located at the farthest B-direction negative side of the drive arm 76 in the plan view. The recessed part 95 is disposed in an area overlapping an extreme tip portion P5 located at the farthest B-direction positive side of the drive arm 77 in the plan view. The recessed part 96 is disposed in an area overlapping an extreme tip portion P6 located at the farthest B-direction negative side of the drive arm 78 in the plan view.

Thus, substantially the same advantages as those of the recessed part 91 can be obtained with respect to the recessed parts 92, 93, 94, 95, and 96. In other words, it becomes difficult for the contact of the detection arm 72 and the drive arms 75, 76, 77, and 78 with the support substrate 4 to occur.

It should be noted that the extreme tip part P1 of the detection arm 71 is also referred to as a tip portion in the B direction of the detection arm 71. Similarly, the extreme tip portion P2 of the detection arm 72, the extreme tip portion P3 of the drive arm 75, the extreme tip portion P4 of the drive arm 76, the extreme tip portion P5 of the drive arm 77, and the extreme tip portion P6 of the drive arm 78 are also referred to as a tip portion in the B direction of the detection arm 72, a tip portion in the B direction of the drive arm 75, a tip portion in the B direction of the drive arm 76, a tip portion in the B direction of the drive arm 77, and a tip portion in the B direction of the drive arm 78, respectively.

As shown in FIG. 9, FIG. 10, FIG. 11, and FIG. 12, the recessed parts 91, 92, 93, 94, 95, and 96 each have a shape recessed toward the lower surface of the support substrate 4 from the upper surface of the support substrate 4.

The recessed parts 91, 92, 93, 94, 95, and 96 are formed by performing half etching on the support substrate 4 from the upper surface using a photolithography technique and an etching technique.

As the etching technique, there is used wet etching using a wet process, or dry etching using a dry process. In the wet etching, the etching process is performed using, for example, buffered hydrofluoric acid, which is a compound liquid of hydrofluoric acid and ammonium fluoride, as an etching liquid. In the dry etching, etching is performed using a fluorine series gas such as $CHF_3$ or $CF_4$ as an etching gas.

In the present embodiment, the recessed parts 91, 92, 93, 94, 95, and 96 are formed using the dry etching.

In the present embodiment, the recessed parts 91, 92, 93, 94, 95, and 96 are each a bottomed groove extending along the B direction. An end portion in the B direction of each of the recessed parts 91, 92, 93, 94, 95, and 96 opens on an inner circumferential surface and an outer circumferential surface of the base-body fixation part 41. In other words, the recessed parts 91, 92, 93, 94, 95, and 96 each have an opening on the upper surface, the inner circumferential surface, and the outer circumferential surface of the base-body fixation part 41. The inner circumferential surface of the base-body fixation part 41 means a surface opposed to the element support part 40 out of the side surfaces for coupling the upper surface and the lower surface of the base-body fixation part 41 to each other, and the outer circumferential surface of the base-body fixation part 41 means a surface opposed to the inner circumferential surface of the base-body fixation part 41 out of the side surfaces of the base-body fixation part 41.

The base-body fixation part 41 in an area where the recessed parts 91, 92, 93, 94, 95, and 96 are not formed is larger in thickness than the base-body fixation part 41 in an area where the recessed part 91, 92, 93, 94, 95, or 96 is formed. In other words, the base-body fixation part 41 in the area where the recessed parts 91, 92, 93, 94, 95, and 96 are not formed is a thick-wall portion of the base-body fixation part 41, and the base-body fixation part 41 in the area where the recessed part 91, 92, 93, 94, 95, or 96 is formed is a thin-wall portion of the base-body fixation part 41.

In the present embodiment, the thick-wall portion of the base-body fixation part 41 is disposed so as to sandwich the recessed part 91, 92, 93, 94, 95, or 96 from two directions, namely the A-direction positive side and the A-direction negative side in the plan view.

The recessed parts 91, 92, 93, 94, 95, and 96 each have a bottom surface 100, a first side surface 101, and a second side surface 102. The first side surface 101 and the second side surface 102 are surfaces for coupling a bottom surface 100 of each of the recessed parts 91, 92, 93, 94, 95, and 96 and the upper surface of the base-body fixation part 41 to each other. The first side surface 101 and the second side surface 102 are opposed to each other along the B direction. The first side surface 101 is arranged on an interface between the recessed part 91 and the thick-wall portion disposed at the A-direction negative side of the recessed part 91. In other words, the first side surface 101 is arranged in an end portion at the A-direction negative side of the bottom surface 100. The second side surface 102 is arranged on an interface between the recessed part 91 and the thick-wall portion disposed at the A-direction positive side of the recessed part 91. In other words, the second side surface 102 is arranged in an end portion at the A-direction positive side of the bottom surface 100.

Here, the width along the A direction of the recessed parts 91, 92 is defined as Wa1, and the width along the A direction of the recessed parts 93, 94, 95, and 96 is defined as Wa2. Here, the width along the A direction of the tip portions of the detection arms 71, 72 is defined as Wb1, and the width along the A direction of the tip portions of the drive arms 75, 76, 77, and 78 is defined as Wb2. It should be noted that the width along the A direction is also referred to simply as a "width."

The width Wa1 of the recessed parts 91, 92 is larger than the width Wb1 of the tip portions of the detection arms 71, 72. In other words, Wa1>Wb1 is true.

By disposing the recessed parts 91, 92 configured in such a manner in the areas overlapping the tip portions of the detection arms 71, 72 in the plan view, respectively, it becomes difficult for the contact between the detection arms 71, 72 and the support substrate 4 to occur when the detection arms 71, 72 bend toward the support substrate 4 due to, for example, an impact from the outside, respectively.

The width Wa2 of the recessed parts 93, 94, 95, and 96 is larger than the width Wb2 of the tip portions of the drive arms 75, 76, 77, and 78. In other words, Wa2>Wb2 is true.

By disposing the recessed parts 93, 94, 95, and 96 configured in such a manner in the areas overlapping the tip portions of the drive arms 75, 76, 77, and 78 in the plan view, respectively, it becomes difficult for the contact between the drive arms 75, 76, 77, and 78 and the support substrate 4 to occur when the drive arms 75, 76, 77, and 78 bend toward the support substrate 4 due to, for example, an impact from the outside, respectively.

Incidentally, as shown in FIG. 8, the detection arms 71, 72 extend toward the both sides in the B direction from the base part 70, and the drive arms 75, 76, 77, and 78 extend toward the both sides in the B direction of the tip portions of the coupling arms 73, 74 which extend toward the both sides in the A direction from the base part 70. In other words, the drive arms 75, 76, 77, and 78 are coupled to the base part 70 via the coupling arms 73, 74, and are arranged farther from the base part 70 than the detection arms 71, 72.

The vibrator element 6 is fixed to the element support part 40 in the base part 70. Therefore, when the impact from the outside or the like is applied, a displacement of each of the detection arms 71, 72 arranged at positions close to the element support part 40 to which the base part 70 is fixed, and a displacement of each of the drive arms 75, 76, 77, and 78 arranged farther from the element support part 40 than the detection arms 71, 72 are different from each other.

Figure 13:
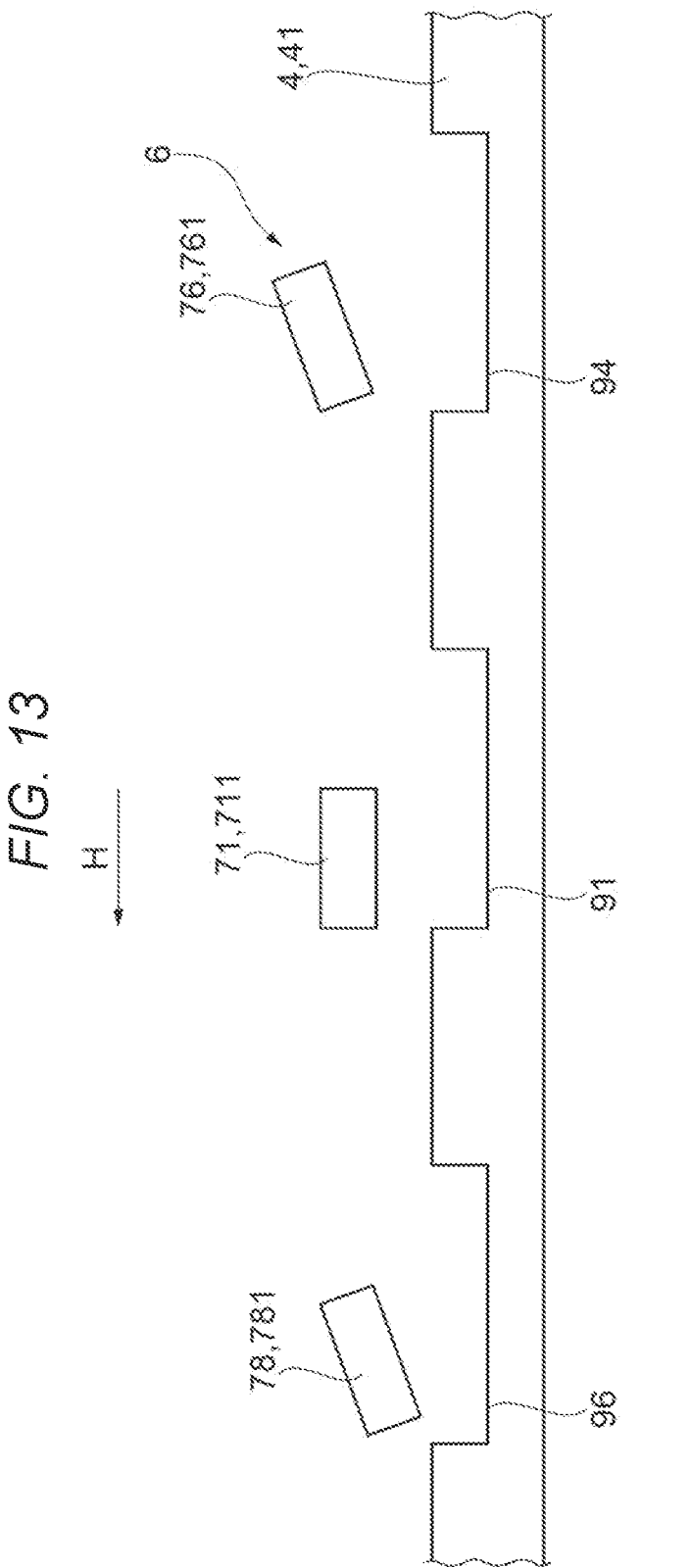
FIG. 13 is a schematic diagram for explaining a displacement of the vibrator element.

FIG. 13 is a diagram schematically showing an example of the displacement of the vibrator element 6 when the impact from the outside or the like is applied to the vibrator element 6 shown in FIG. 8. In particular, FIG. 13 is a diagram schematically showing displacements of the wide part 711 provided to the tip portion of the detection arm 71 and the wide parts 761, 781 provided to the tip portions of the respective drive arms 76, 78 when, for example, the acceleration toward the A-direction positive side is applied as the impact from the outside.

As shown in FIG. 13, when the acceleration toward the A-direction positive side is applied, an inertial force toward the A-direction negative side indicated by the arrow H acts on the detection arm 71 and the drive arms 76, 78. Therefore, the tip portion of the detection arm 71 is displaced toward the A-direction negative side. Since the detection arm 71 is arranged at the position close to the element support part 40, the displacement in the C direction in the tip portion of the detection arm 71 is small. Since the drive arms 76, 78 are arranged at positions farther from the element support part 40 compared to the detection arm 71, the tip portions of the drive arms 76, 78 are displaced toward the A-direction negative side, and are at the same time, also displaced in the C direction with a larger displacement compared to the tip portion of the detection arm 71. In particular, the tip portion of the drive arm 76 is displaced toward the A-direction negative side, and is at the same time, displaced toward the C-direction positive side. The tip portion of the drive arm 78 is displaced toward the A-direction negative side, and is at the same time, displaced toward the C-direction negative side. Although not shown in the drawings, the tip portion of the detection arm 72 is displaced similarly to the tip portion of the detection arm 71. The tip portion of the drive arm 75 is displaced similarly to the tip portion of the drive arm 76. The tip portion of the drive arm 77 is displaced similarly to the tip portion of the drive arm 78.

It should be noted that when acceleration toward the A-direction negative side is applied, the tip portions of the detection arms 71, 72 are displaced toward the A-direction positive side. The displacement in the C direction in each of the tip portions of the detection arms 71, 72 is small. The tip portions of the drive arms 75, 76 are displaced toward the A-direction positive side, and are at the same time, displaced toward the C-direction negative side with a larger displacement compared to the tip portions of the detection arms 71, 72. The tip portions of the drive arms 77, 78 are displaced toward the A-direction positive side, and are at the same time, displaced toward the C-direction positive side with a larger displacement compared to the tip portions of the detection arms 71, 72.

As described above, when an impact from the outside or the like is applied, the tip portions of the drive arms 75, 76, 77, and 78 generate the displacement in the A direction, and at the same time, also generate the larger displacement in the C direction compared to the tip portions of the detection arms 71, 72.

Here, returning to FIG. 9, FIG. 10, FIG. 11, and FIG. 12, a relationship between the width Wa1 of the recessed parts 91, 92, the width Wa2 of the recessed parts 93, 94, 95, and 96, the width Wb1 of the detection arms 71, 72, and the width Wb2 of the drive arms 75, 76, 77, and 78 will be described.

A difference Wa1–Wb1 between the width Wa1 of the recessed parts 91, 92 and the width Wb1 of the detection arms 71, 72 represents a size of a gap between each of the recessed parts 91, 92 and corresponding one of the detection arms 71, 72 in the A direction. A difference Wa2–Wb2 between the width Wa2 of the recessed parts 93, 94, 95, and 96 and the width Wb2 of the drive arms 75, 76, 77, and 78 represents a size of a gap between each of the recessed parts 93, 94, 95, and 96 and corresponding one of the drive arms 75, 76, 77, and 78 in the A direction.

In the present embodiment, the difference Wa2–Wb2 between the width Wa2 of the recessed parts 93, 94, 95, and 96 and the width Wb2 of the drive arms 75, 76, 77, and 78 is made larger than the difference Wa1–Wb1 between the width Wa1 of the recessed parts 91, 92 and the width Wb1 of the detection arms 71, 72. In other words, the difference Wa1–Wb1 and the difference Wa2–Wb2 fulfill Wa2–Wb2>Wa1–Wb1.

As described above, by making the difference Wa2–Wb2 larger than the difference Wa1–Wb1, it becomes difficult for the contact between the drive arms 75, 76, 77, and 78 and the support substrate 4 to occur when the tip portions of the drive arms 75, 76, 77, and 78 are displaced toward the C-direction negative side, namely toward the support substrate 4, while being displaced toward the A direction due to an impact or the like from the A direction.

Further, since it is possible to make the difference Wa1–Wb1 smaller than the difference Wa2–Wb2, an excessive increase in the width Wa1 of the recessed parts 91, 92 is suppressed, and it is possible to increase the rigidity of the support substrate 4.

It should be noted that in the present embodiment, although the extreme tip portions P1, P2 of the detection arms 71, 72 and the extreme tip portions P3, P4, P5, and P6 of the drive arms 75, 76, 77, and 78 are arranged so as to overlap the support substrate 4 in the plan view, it is possible for the extreme tip portions P1, P2 of the detection arms 71, 72 and the extreme tip portions P3, P4, P5, and P6 of the drive arms 75, 76, 77, and 78 to be arranged not to overlap the support substrate 4 in the plan view. For example, it is possible for the extreme tip portions P1, P2 of the detection arms 71, 72 and the extreme tip portions P3, P4, P5, and P6 of the drive arms 75, 76, 77, and 78 to be arranged at an outer side of the outer circumferential surface of the base-body fixation part 41 in the plan view. Also in such a configuration, by disposing the recessed parts 91, 92, 93, 94, 95, and 96 in the area overlapping the detection arms 71, 72 and the drive arms 75, 76, 77, and 78 in the plan view of the side of the surface opposed to the vibrator element 6 in the support substrate 4, the contact of the detection arms 71, 72 and the drive arms 75, 76, 77, and 78 with the support substrate 4 becomes difficult to occur.

In other words, by disposing the recessed parts 91, 92, 93, 94, 95, and 96 corresponding to the detection arms 71, 72 and the drive arms 75, 76, 77, and 78 in the area which is located at the side of the surface opposed to the vibrator element 6 in the support substrate 4, namely the upper surface of the base-body fixation part 41, and with which at least a part of the detection arms 71, 72 and the drive arms 75, 76, 77, and 78 overlaps in the plan view, it becomes difficult for the contact of the detection arms 71, 72 and the drive arms 75, 76, 77, and 78 with the support substrate 4 to occur, and thus, the breakage of the detection arms 71, 72 and the drive arms 75, 76, 77, and 78 due to the contact is prevented.

As described hereinabove, according to the present embodiment, the following advantages can be obtained.

The vibrator device 1 includes the vibrator element 6 having the base part 70, and the detection arms 71, 72 and the drive arms 75, 76, 77, and 78 as the plurality of vibrating arms extending in the B direction as the first direction from the base part 70, the base body 21, and the support substrate 4 for supporting the vibrator element 6 to the base body 21, wherein the support substrate 4 includes the base-body fixation part 41 to be fixed to the base body 21, the element support part 40 for supporting the base part 70 of the vibrator element 6, and the beam parts 42, 43, 44, and 45 for coupling the base-body fixation part 41 and the element support part 40 to each other, and the support substrate 4 has the plurality of recessed parts 91, 92, 93, 94, 95, and 96 corresponding respectively to the plurality of vibrating arms 71, 72, 75, 76, 77, and 78 in the areas which are located on the upper surface at the side of the surface opposed to the vibrator element 6, and on which at least a part of the vibrating arms 71, 72, 75, 76, 77, and 78 overlaps in the plan view.

Thus, the contact of the detection arms 71, 72 and the drive arms 75, 76, 77, and 78 as the vibrating arms with the support substrate 4 due to the impact or the like from the outside becomes difficult to occur. Since the contact of the detection arms 71, 72 and the drive arms 75, 76, 77, and 78 with the support substrate 4 becomes difficult to occur, the breakage of the drive arms 75, 76, 77, and 78 and the detection arms 71, 72 due to the contact is inhibited.

2. Embodiment 2

Then, a vibrator device 1 according to Embodiment 2 will be described with reference to FIG. 14 and FIG. 15. It should be noted that constituents substantially the same as in Embodiment 1 described above are denoted by the same reference symbols, and the description thereof will be omitted.

The vibrator device 1 according to Embodiment 2 is substantially the same as in Embodiment 1 except the point that the first side surface 101 and the second side surface 102 of each of the recessed parts 91, 92, 93, 94, 95, and 96 each have a tilted surface.

Therefore, in the following description, the present embodiment will be described with a focus on the difference from the embodiment described above, and the description of substantially the same issues will be omitted.

Further, in the present embodiment, since the recessed part 91 corresponding to the detection arm 71 and the recessed part 92 corresponding to the detection arm 72 are substantially the same in configuration, the recessed part 91 will be described as a representative, and the description of the recessed part 92 will be omitted. Further, since the recessed part 93 corresponding to the drive arm 75, the recessed part 94 corresponding to the drive arm 76, the recessed part 95 corresponding to the drive arm 77, and the recessed part 96 corresponding to the drive arm 78 are substantially the same in configuration, the recessed part 96 is described as a representative, and the description of the recessed parts 93, 94, and 95 will be omitted.

Figure 14:
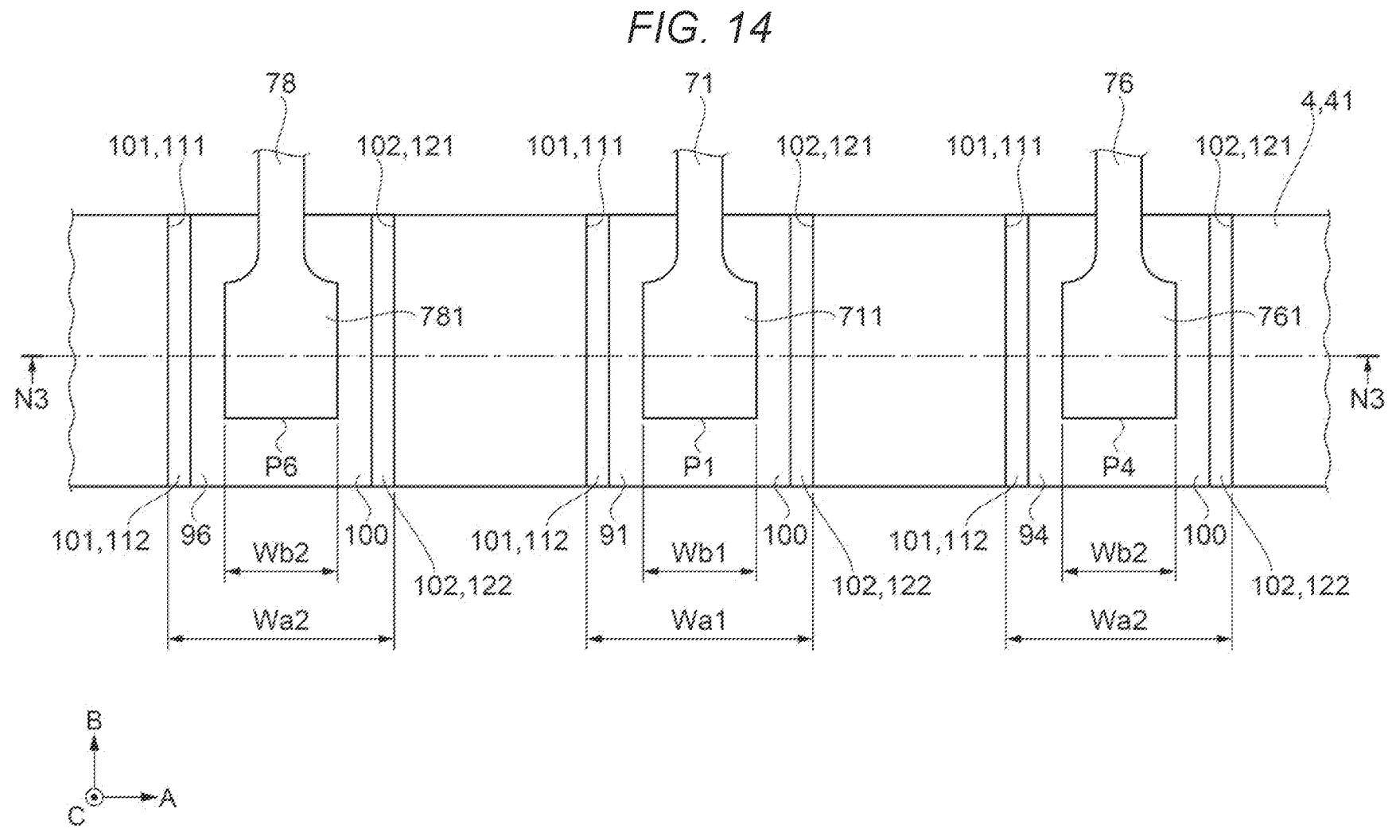
Figure 15:
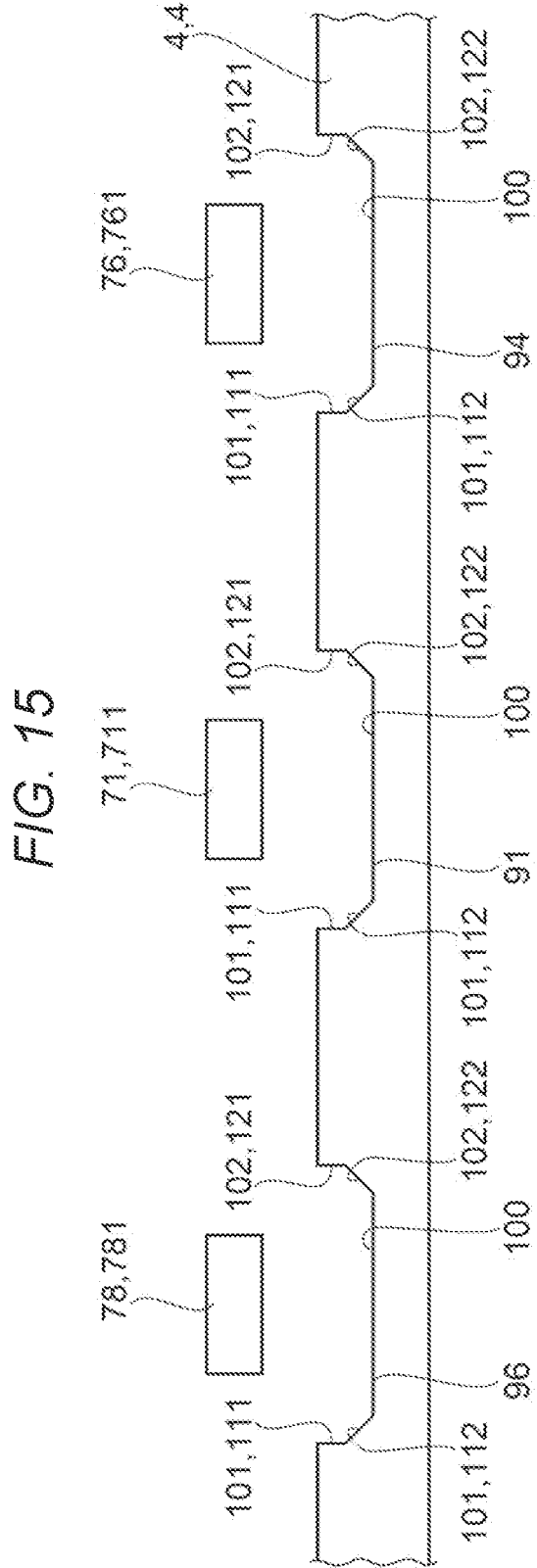
FIG. 15 is a cross-sectional view along the line N3-N3 in FIG. 14.
Figure 15:
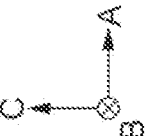

As shown in FIG. 14 and FIG. 15, the first side surface 101 of the recessed part 91 has a first side surface part 111 and a second side surface part 112. An upper end of the first side surface part 111 is coupled to the upper surface of the base-body fixation part 41, and a lower end of the first side surface part 111 is coupled to an upper end of the second side surface part 112. The upper end of the second side surface part 112 is coupled to the lower end of the first side surface part 111, and a lower end of the second side surface part 112 is coupled to the bottom surface 100 of the recessed part 91. The second side surface part 112 is a tilted surface. The second side surface part 112 is tilted so as to come closer to the second side surface 102 while proceeding toward the bottom surface 100 of the recessed part 91, in other words, the second side surface part 112 is a tilted surface which decreases in distance toward the bottom surface 100 of the recessed part 91.

Further, the second side surface 102 of the recessed part 91 has a first side surface part 121 and a second side surface part 122. An upper end of the first side surface part 121 is coupled to the upper surface of the base-body fixation part 41, and a lower end of the first side surface part 121 is coupled to an upper end of the second side surface part 122. The upper end of the second side surface part 122 is coupled to the lower end of the first side surface part 121, and a lower end of the second side surface part 122 is coupled to the bottom surface 100 of the recessed part 91. The second side surface part 122 is a tilted surface. The second side surface part 122 is tilted so as to come closer to the first side surface 101 while proceeding toward the bottom surface 100 of the recessed part 91, in other words, the second side surface part 122 is a tilted surface which decreases in distance toward the bottom surface 100 of the recessed part 91.

Since the first side surface 101 and the second side surface 102 respectively have the second side surface parts 112, 122 as the tilted surfaces which decrease in distance toward the bottom surface 100 of the recessed part 91 in the recessed part 91 as described above, stress concentration in a coupling part between the first side surface 101 and the bottom surface 100 and a coupling part between the second side surface 102 and the bottom surface 100 is inhibited. Since the stress concentration in the coupling part between the first side surface 101 and the bottom surface 100 and the coupling part between the second side surface 102 and the bottom surface 100 is inhibited, it is possible to prevent breakage of the support substrate 4.

Similarly to the recessed part 91, the first side surface 101 of the recessed part 96 has the first side surface part 111 and the second side surface part 112, and the second side surface 102 of the recessed part 96 has the first side surface part 121 and the second side surface part 122. The second side surface parts 112, 122 are each a tilted surface which decreases in distance toward the bottom surface 100 of the recessed part 96.

Since the first side surface 101 and the second side surface 102 respectively have the second side surface parts 112, 122 as the tilted surfaces which decrease in distance toward the bottom surface 100 of the recessed part 96 in the recessed part 96 as described above, stress concentration in the coupling part between the first side surface 101 and the bottom surface 100 and the coupling part between the second side surface 102 and the bottom surface 100 is inhibited. Since the stress concentration in the coupling part between the first side surface 101 and the bottom surface 100 and the coupling part between the second side surface 102 and the bottom surface 100 is inhibited, it is possible to prevent breakage of the support substrate 4.

The same as the recessed parts 91, 96 also applies to the recessed parts 92, 93, 94, and 95.

Further, in the present embodiment, the recessed parts 91, 92, 93, 94, 95, and 96 are formed using the wet etching. By forming the recessed parts 91, 92, 93, 94, 95, and 96 using the wet etching, it is possible to easily form the second side surface parts 112, 122 as the tilted surfaces using etching anisotropy caused by the crystal axes of the quartz crystal substrate constituting the support substrate 4.

It should be noted that in the present embodiment, the second side surface parts 112, 122 are the tilted surfaces, but it is possible for both of the first side surface parts 111, 121 and the second side surface parts 112, 122 to be the tilted surfaces. Further, the first side surface 101 and the second side surface 102 respectively have the two types of side surface parts, namely the first side surface parts 111, 121 and the second side surface parts 112, 122, but can also have three or more types of side surface parts.

According to the present embodiment, the following advantages can be obtained in addition to the advantages in Embodiment 1.

Since the first side surface 100 and the second side surface 102 of each of the recessed parts 91, 92, 93, 94, 95, and 96 have the second side surface parts 112, 122 as the tilted surfaces which decrease in distance toward the bottom surface 100 of the recessed parts 91, 92, 93, 94, 95, and 96, respectively, the stress concentration in the coupling part between the first side surface 101 and the bottom surface 100 and the coupling part between the second side surface 102 and the bottom surface 100 is inhibited, and thus, it is possible to prevent the breakage of the support substrate 4.

3. Embodiment 3

Then, a vibrator device 1 according to Embodiment 3 will be described with reference to FIG. 16, FIG. 17, and FIG. 18. It should be noted that constituents substantially the same as in Embodiment 1 described above are denoted by the same reference symbols, and the description thereof will be omitted.

The vibrator device 1 according to Embodiment 3 is substantially the same as in Embodiment 1 except the point that a thick-wall portion is disposed between each of the recessed parts 91, 92, 93, 94, 95, and 96 and an inner circumferential surface of the base-body fixation part 41. Therefore, in the following description, the present embodiment will be described with a focus on the difference from the embodiment described above, and the description of substantially the same issues will be omitted.

Further, in the present embodiment, since the recessed part 91 corresponding to the detection arm 71 and the recessed part 92 corresponding to the detection arm 72 are substantially the same in configuration, the recessed part 91 will be described as a representative, and the description of the recessed part 92 will be omitted. Further, since the recessed part 93 corresponding to the drive arm 75, the recessed part 94 corresponding to the drive arm 76, the recessed part 95 corresponding to the drive arm 77, and the recessed part 96 corresponding to the drive arm 78 are substantially the same in configuration, the recessed part 96 is described as a representative, and the description of the recessed parts 93, 94, and 95 will be omitted.

Figure 16:
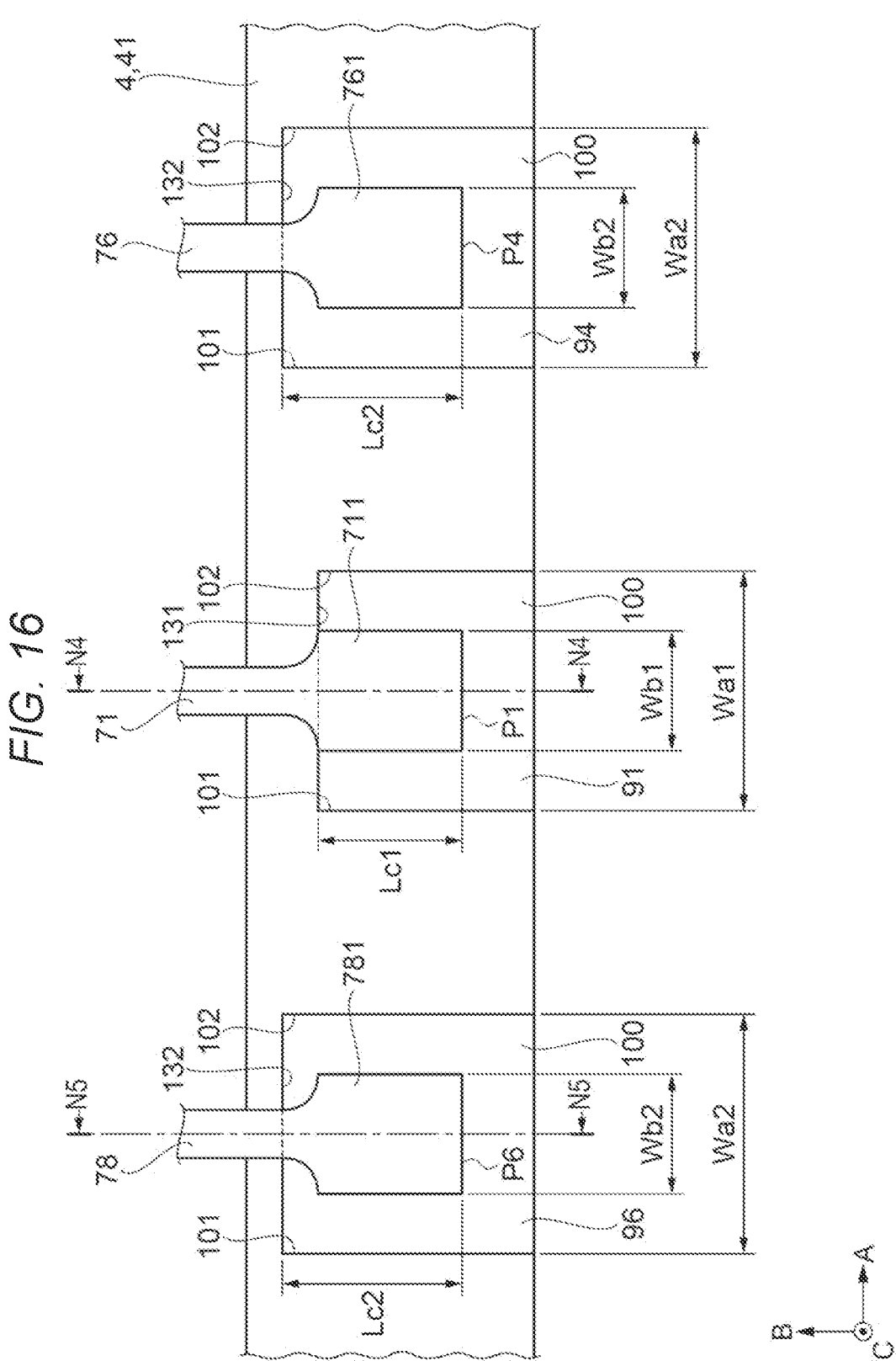
FIG. 16 is a plan view corresponding to a position of an M1 part of a vibrator device according to Embodiment 3.
Figure 17:
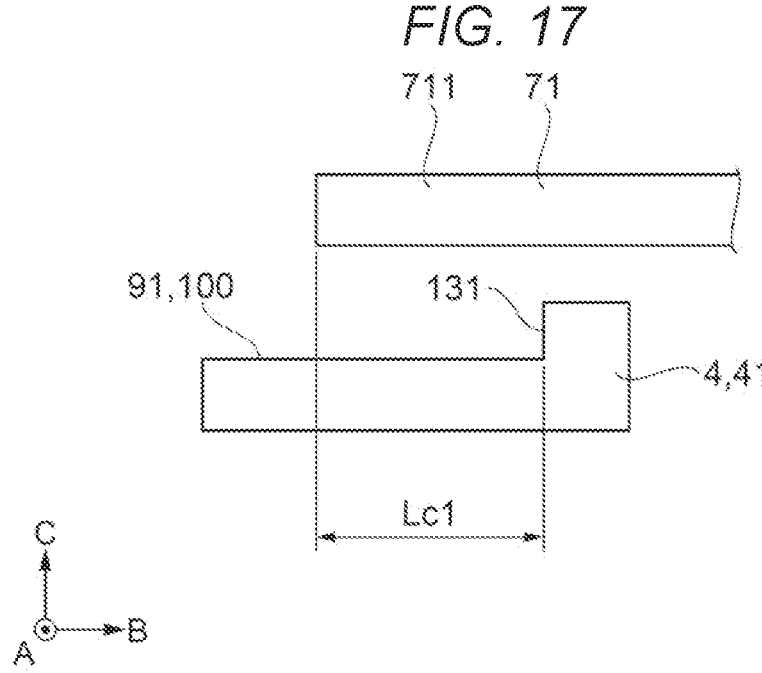
FIG. 17 is a cross-sectional view along the line N4-N4 in FIG. 16.
Figure 18:
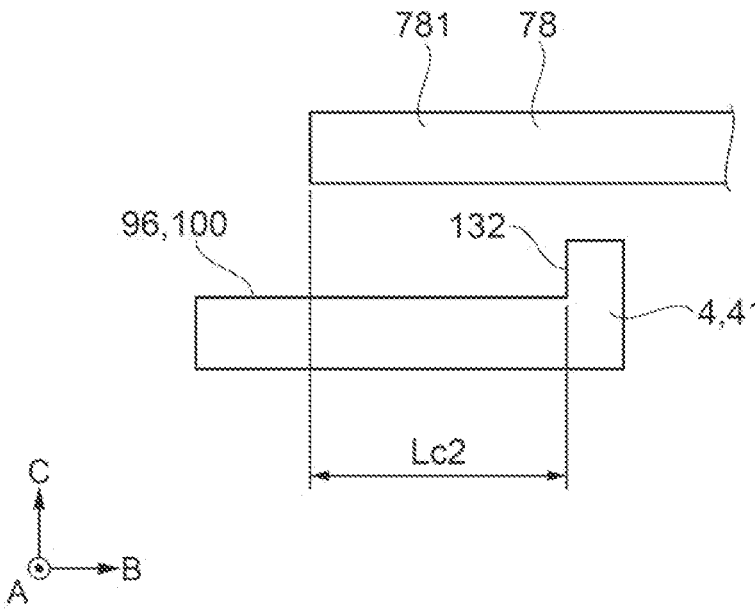
FIG. 18 is a cross-sectional view along the line N5-N5 in FIG. 16.

As shown in FIG. 16, FIG. 17, and FIG. 18, in the present embodiment, the thick-wall portion is disposed between each of the recessed parts 91, 92, 93, 94, 95, and 96 and the inner circumferential surface of the base-body fixation part 41. In particular, the thick-wall portion of the base-body fixation part 41 is disposed at the A-direction positive side and the A-direction negative side of the recessed part 91 and the recessed part 96, between the recessed part 91 and the inner circumferential surface of the base-body fixation part 41, and between the recessed part 96 and the inner circumferential surface of the base-body fixation part 41 in the plan view. In other words, in the plan view, the recessed part 91 is surrounded by the thick-wall portion of the base-body fixation part 41 from three directions, namely the A-direction positive side of the recessed part 91, the A-direction negative side of the recessed part 91, and the inner circumferential surface side of the base-body fixation part 41 as one side in the B direction of the recessed part 91, and the recessed part 96 is surrounded by the thick-wall portion of the base-body fixation part 41 from three directions, namely the A-direction positive side of the recessed part 96, the A-direction negative side of the recessed part 96, and the inner circumferential surface side of the base-body fixation part 41 as one side in the B direction of the recessed part 96. The inner circumferential surface side of the base-body fixation part 41 as one side in the B direction of the recessed part 91 or the recessed part 96 means the B-direction positive side of the recessed part 91 or the recessed part 96.

As shown in FIG. 16 and FIG. 17, the recessed part 91 has the bottom surface 100, the first side surface 101, the second side surface 102, and a third side surface 131. The third side surface 131 is disposed on an interface between the recessed part 91 and the thick-wall portion disposed between the recessed part 91 and the inner circumferential surface of the base-body fixation part 41. In other words, the third side surface 131 is arranged in an end portion at the B-direction positive side as the inner circumferential surface side of the base-body fixation part 41 in the bottom surface 100.

The third side surface 131 of the recessed part 91 is arranged closer to the base-end portion of the detection arm 71 than the tip portion of the detection arm 71. In particular, the third side surface 131 of the recessed part 91 is arranged at the B-direction positive side of the extreme tip portion P1 of the detection arm 71.

By configuring the recessed part 91 in such a manner, it becomes difficult for the contact between the detection arm 71 and the support substrate 4 to occur when the detection arm 71 bends toward the support substrate 4 due to the impact from the outside and so on.

Further, since the thick-wall portion is also disposed between the recessed part 91 and the inner circumferential surface of the base-body fixation part 41, the rigidity of the support substrate 4 increases.

The recessed part 92 is substantially the same as the recessed part 91.

Although not shown in the drawings, the thick-wall portion is also disposed between the recessed part 92 and the inner circumferential surface of the base-body fixation part 41. In particular, the recessed part 92 is surrounded by the thick-wall portion of the base-body fixation part 41 from three directions, namely the A-direction positive side of the recessed part 92, the A-direction negative side of the recessed part 92, and the inner circumferential surface side of the base-body fixation part 41 as one side in the B direction of the recessed part 92 in the plan view. The recessed part 92 has the third side surface 131 arranged at the B-direction negative side, namely closer to the base-end portion of the detection arm 72 than the extreme tip portion P2 of the detection arm 72.

Further, as shown in FIG. 16 and FIG. 18, the recessed part 96 has the bottom surface 100, the first side surface 101, the second side surface 102, and a fourth side surface 132. The fourth side surface 132 is disposed on an interface between the recessed part 96 and the thick-wall portion disposed between the recessed part 96 and the inner circumferential surface of the base-body fixation part 41. In other words, the fourth side surface 132 is arranged in an end portion at the B-direction positive side as the inner circumferential surface side of the base-body fixation part 41 in the bottom surface 100.

The fourth side surface 132 of the recessed part 96 is arranged closer to the base-end portion of the drive arm 78 than the tip portion of the drive arm 78. In particular, the fourth side surface 132 of the recessed part 96 is arranged at the B-direction positive side of the extreme tip portion P6 of the drive arm 78.

By configuring the recessed part 96 in such a manner, it becomes difficult for the contact between the drive arm 78 and the support substrate 4 to occur when the drive arm 78 bends toward the support substrate 4 due to the impact from the outside and so on.

Further, since the thick-wall portion is also disposed between the recessed part 96 and the inner circumferential surface of the base-body fixation part 41, the rigidity of the support substrate 4 increases.

The recessed parts 93, 94, and 95 are substantially the same as the recessed part 96.

As shown in FIG. 16, the thick-wall portion is also disposed between the recessed part 94 and the inner circumferential surface of the base-body fixation part 41. In particular, the recessed part 94 is surrounded by the thick-wall portion of the base-body fixation part 41 from three directions, namely the A-direction positive side of the recessed part 94, the A-direction negative side of the recessed part 94, and the inner circumferential surface side of the base-body fixation part 41 as one side in the B direction of the recessed part 94 in the plan view. The recessed part 94 has the fourth side surface 132 arranged at the B-direction positive side, namely closer to the base-end portion of the drive arm 76 than the extreme tip portion P4 of the drive arm 76.

Although not shown in the drawings, the thick-wall portion is also disposed between the recessed part 93 and the inner circumferential surface of the base-body fixation part 41, and between the recessed part 95 and the inner circumferential surface of the base-body fixation part 41. In particular, in the plan view, the recessed part 93 is surrounded by the thick-wall portion of the base-body fixation part 41 from three directions, namely the A-direction positive side of the recessed part 93, the A-direction negative side of the recessed part 93, and the inner circumferential surface side of the base-body fixation part 41 as one side in the B direction of the recessed part 93, and the recessed part 95 is surrounded by the thick-wall portion of the base-body fixation part 41 from three directions, namely the A-direction positive side of the recessed part 95, the A-direction negative side of the recessed part 95, and the inner circumferential surface side of the base-body fixation part 41 as one side in the B direction of the recessed part 95. The recessed part 93 has the fourth side surface 132 arranged at the B-direction negative side, namely closer to the base-end portion of the drive arm 75 than the extreme tip portion P3 of the drive arm 75. The recessed part 95 has the fourth side surface 132 arranged at the B-direction negative side, namely closer to the base-end portion of the drive arm 77 than the extreme tip portion P5 of the drive arm 77.

Incidentally, as described above, when the impact from the outside or the like is applied, a displacement of each of the detection arms 71, 72 arranged at positions close to the element support part 40 to which the base part 70 is fixed, and a displacement of each of the drive arms 75, 76, 77, and 78 arranged farther from the element support part 40 than the detection arms 71, 72 are different from each other.

Here, as shown in FIG. 16, FIG. 17, and FIG. 18, a distance in the B direction between the tip portion, specifically the extreme tip portion P1, of the detection arm 71 and the third side surface 131 of the recessed part 91 is defined as Lc1. A distance in the B direction between the tip portion, specifically the extreme tip portion P6, of the drive arm 78 and the fourth side surface 132 of the recessed part 96 is defined as Lc2.

In the present embodiment, the distance Lc2 between the tip portion of the drive arm 78 and the fourth side surface 132 of the recessed part 96 is made longer than the distance Lc1 between the tip portion of the detection arm 71 and the third side surface 131 of the recessed part 91. In other words, the distance Lc1 and the distance Lc2 fulfill Lc2>Lc1.

As described above, by making the distance Lc2 between the tip portion of the drive arm 78 and the fourth side surface 132 of the recessed part 96 longer than the distance Lc1 between the tip portion of the detection arm 71 and the third side surface 131 of the recessed part 91, the contact between the drive arm 78 and the support substrate 4 becomes difficult to occur when the tip portion of the drive arm 78 is displaced toward the C-direction negative side, namely toward the support substrate 4 while being displaced toward the A direction due to an impact from the A direction or the like.

Further, since it is possible to make the distance Lc1 shorter compared to the distance Lc2, the thick-wall portion disposed between the third side surface 131 of the recessed part 91 and the inner circumferential surface of the base-body fixation part 41 can be enlarged in the B direction. Thus, the rigidity of the support substrate 4 further increases.

The recessed part 92 is substantially the same as the recessed part 91, and the recessed parts 93, 94, and 95 are substantially the same as the recessed part 96.

In other words, the distance Lc2 between the tip portion of each of the drive arms 75, 76, 77, and 78 and the fourth side surface 132 of each of the recessed parts 93, 94, 95, and 96 is made longer than the distance Lc1 between the tip portion of each of the detection arms 71, 72 and the third side surface 131 of each of the recessed parts 91, 92. Thus, it becomes difficult for the contact between the drive arms

75, 76, 77, and 78 and the support substrate 4 to occur when the tip portions of the drive arms 75, 76, 77, and 78 are displaced toward the C-direction negative side, namely toward the support substrate 4, while being displaced toward the A direction due to the impact or the like from the A direction. Further, the thick-wall portion between the third side surface 131 of each of the recessed parts 91, 92 and the inner circumferential surface of the base-body fixation part 41 can be enlarged in the B direction, and thus, the rigidity of the support substrate 4 further increases.

According to the present embodiment, the following advantages can be obtained in addition to the advantages in Embodiment 1.

Since the thick-wall portion is disposed between each of the recessed parts 91, 92, 93, 94, 95, and 96 and the inner circumferential surface of the base-body fixation part 41, the rigidity of the support substrate 4 increases.

4. Embodiment 4

Then, a vibrator device 1 according to Embodiment 4 will be described with reference to FIG. 19, FIG. 20, and FIG. 21. It should be noted that constituents substantially the same as in Embodiment 3 described above are denoted by the same reference symbols, and the description thereof will be omitted.

The vibrator device 1 according to Embodiment 4 is substantially the same as in Embodiment 3 except the point that a thick-wall portion is disposed between each of the recessed parts 91, 92, 93, 94, 95, and 96 and an outer circumferential surface of the base-body fixation part 41. Therefore, in the following description, the present embodiment will be described with a focus on the difference from the embodiment described above, and the description of substantially the same issues will be omitted.

Further, in the present embodiment, since the recessed part 91 corresponding to the detection arm 71 and the recessed part 92 corresponding to the detection arm 72 are substantially the same in configuration, the recessed part 91 will be described as a representative, and the description of the recessed part 92 will be omitted. Further, since the recessed part 93 corresponding to the drive arm 75, the recessed part 94 corresponding to the drive arm 76, the recessed part 95 corresponding to the drive arm 77, and the recessed part 96 corresponding to the drive arm 78 are substantially the same in configuration, the recessed part 96 is described as a representative, and the description of the recessed parts 93, 94, and 95 will be omitted.

Figure 19:
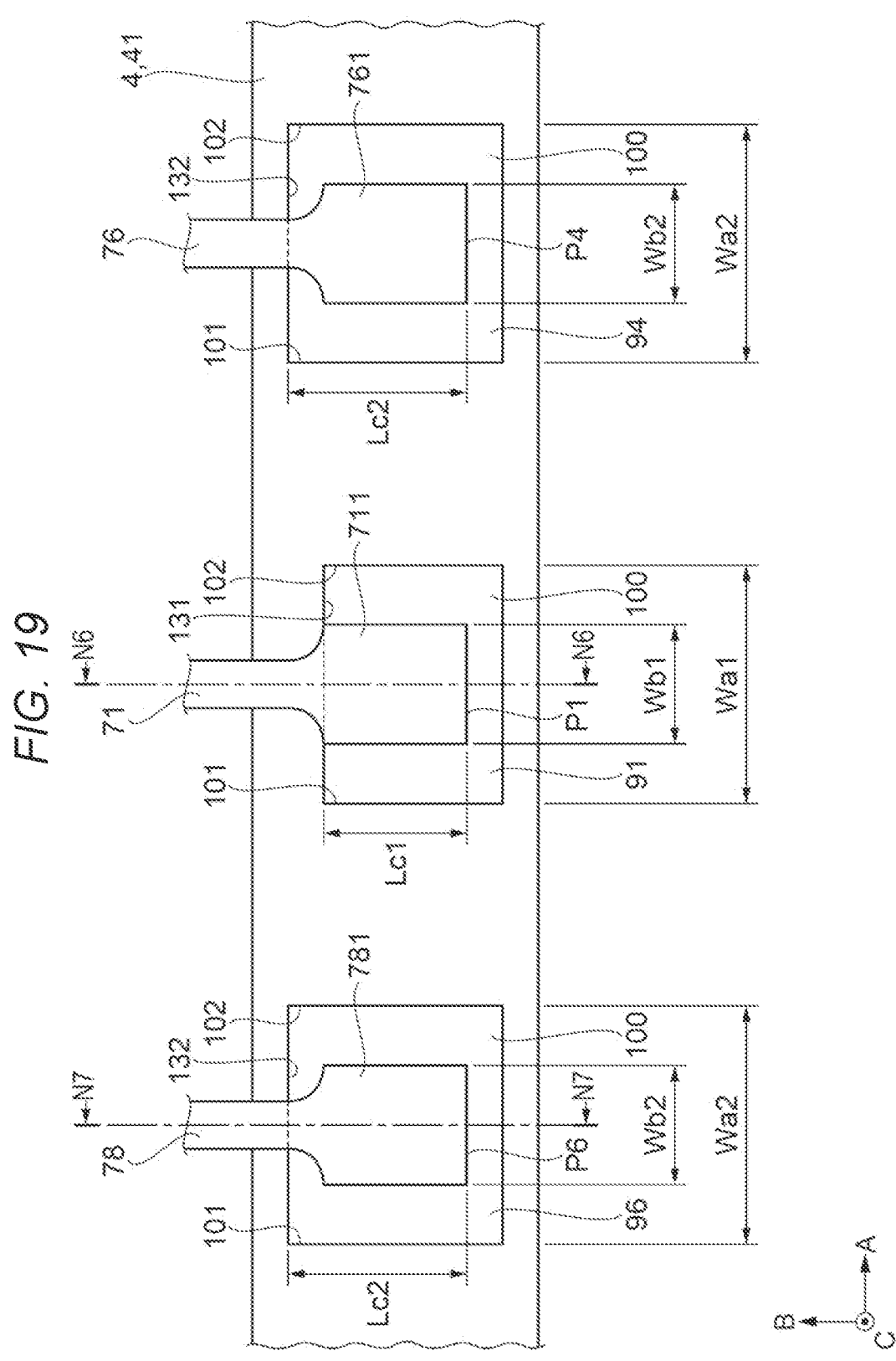
FIG. 19 is a plan view corresponding to a position of an M1 part of a vibrator device according to Embodiment 4.
Figure 20:
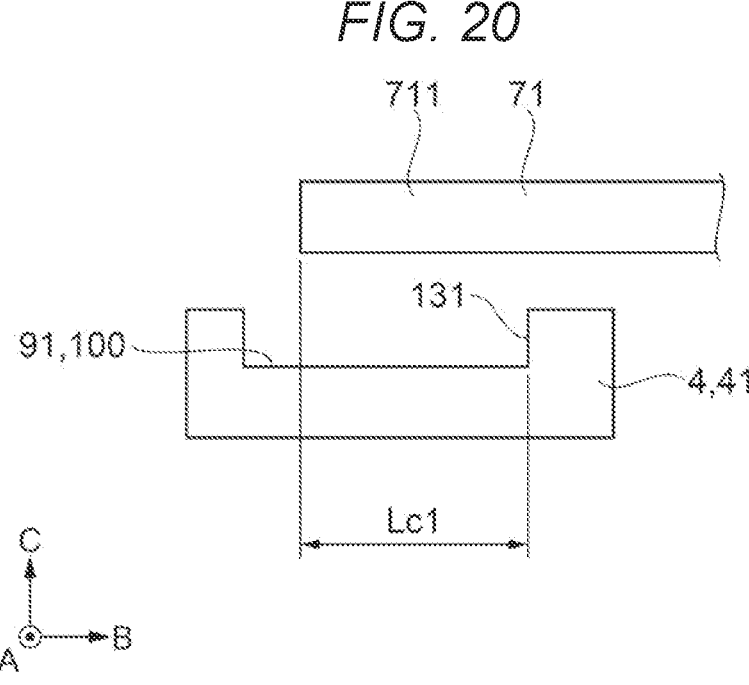
FIG. 20 is a cross-sectional view along the line N6-N6 in FIG. 19.
Figure 21:
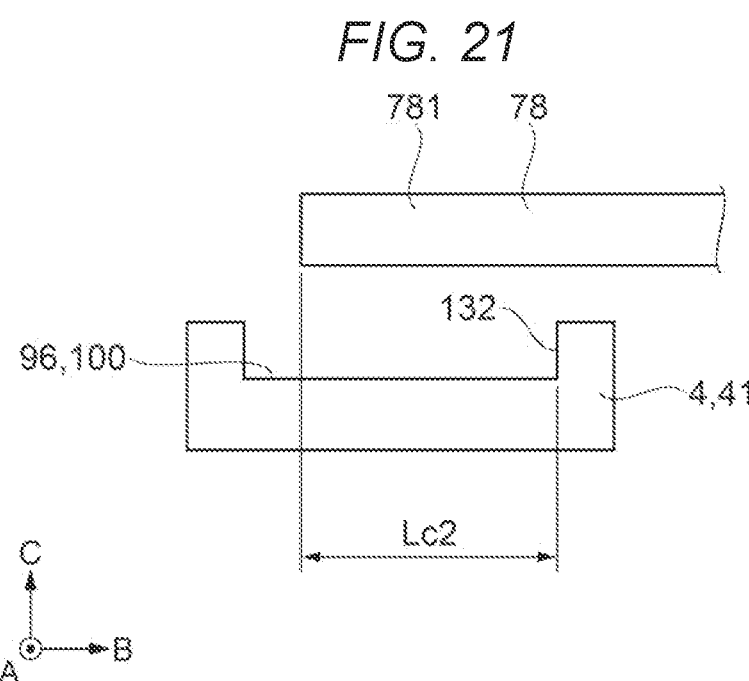
FIG. 21 is a cross-sectional view along the line N7-N7 in FIG. 19.

As shown in FIG. 19, FIG. 20, and FIG. 21, in the present embodiment, the thick-wall portion of the base-body fixation part 41 is disposed at the A-direction positive side and the A-direction negative side of the recessed part 91 and the recessed part 96, between the recessed part 91 and the inner circumferential surface of the base-body fixation part 41, between the recessed part 96 and the inner circumferential surface of the base-body fixation part 41, between the recessed part 91 and the outer circumferential surface of the base-body fixation part 41, and between the recessed part 96 and the outer circumferential surface of the base-body fixation part 41 in the plan view. In other words, the recessed part 91 is surrounded by the thick-wall portion of the base-body fixation part 41 from four directions, namely the A-direction positive side of the recessed part 91, the A-direction negative side of the recessed part 91, the inner circumferential surface side of the base-body fixation part 41 as one side in the B direction of the recessed part 91, and an outer circumferential surface side of the base-body fixation part 41 as the other side in the B direction of the recessed part 91, and the recessed part 96 is surrounded by the thick-wall portion of the base-body fixation part 41 from four directions, namely the A-direction positive side of the recessed part 96, the A-direction negative side of the recessed part 96, the inner circumferential surface side of the base-body fixation part 41 as one side in the B direction of the recessed part 96, and an outer circumferential surface side of the base-body fixation part 41 as the other side in the B direction of the recessed part 96. The inner circumferential surface side of the base-body fixation part 41 as one side in the B direction of the recessed part 91 or the recessed part 96 means the B-direction positive side of the recessed part 91 or the recessed part 96. The outer circumferential surface side of the base-body fixation part 41 as the other side in the B direction of the recessed part 91 or the recessed part 96 means the B-direction negative side of the recessed part 91 or the recessed part 96.

Since the thick-wall portion is also disposed between the recessed part 91 and the outer circumferential surface of the base-body fixation part 41, and between the recessed part 96 and the outer circumferential surface of the base-body fixation part 41 as described above, the rigidity of the support substrate 4 further increases.

The recessed part 92 is substantially the same as the recessed part 91, and the recessed parts 93, 94, and 95 are substantially the same as the recessed part 96.

As shown in FIG. 19, the thick-wall portion is also disposed between the recessed part 94 and the outer circumferential surface of the base-body fixation part 41. In particular, the thick-wall portion of the base-body fixation part 41 is disposed at the A-direction positive side and the A-direction negative side of the recessed part 94, between the recessed part 94 and the inner circumferential surface of the base-body fixation part 41, and between the recessed part 94 and the outer circumferential surface of the base-body fixation part 41 in the plan view.

Although not shown in the drawings, the thick-wall portion is also disposed between the recessed part 93 and the outer circumferential surface of the base-body fixation part 41, and between the recessed part 95 and the outer circumferential surface of the base-body fixation part 41. In particular, the thick-wall portion of the base-body fixation part 41 is disposed at the A-direction positive side and the A-direction negative side of the recessed parts 93, 95, between the recessed part 93 and the inner circumferential surface of the base-body fixation part 41, between the recessed part 95 and the inner circumferential surface of the base-body fixation part 41, between the recessed part 93 and the outer circumferential surface of the base-body fixation part 41, and between the recessed part 95 and the outer circumferential surface of the base-body fixation part 41 in the plan view.

According to the present embodiment, the following advantages can be obtained in addition to the advantages in Embodiment 3.

Since the thick-wall portion is disposed between each of the recessed parts 91, 92, 93, 94, 95, and 96 and the outer circumferential surface of the base-body fixation part 41, the rigidity of the support substrate 4 further increases.

The vibrator device 1 is described hereinabove based on Embodiment 1 through Embodiment 4. It should be noted that the present disclosure is not limited thereto, and the constituents of each section can be replaced with those having arbitrary configurations and substantially the same functions. Further, it is also possible to add any other constituents to the present disclosure. Further, it is also possible to arbitrarily combine any of the embodiments with each other.

For example, it is possible to combine Embodiment 2 and Embodiment 3 with each other.

Further, for example, in the present embodiment, the explanation is presented citing the vibrator element 6 having the detection arms 71, 72 and the drive arms 75, 76, 77, and 78 as the plurality of vibrating arms as an example. However, the vibrator element having the plurality of drive arms is not limited to the vibrator element 6. For example, the vibrator element 6 is not limited to the vibrator element of the double-T structure, and can also be a vibrator element of, for example, a tuning fork type or an H type. Further, the vibrator element 6 can also be a vibrator element using a piezoelectric body other than quartz crystal. Further, the vibrator element 6 can also be an MEMS (Micro Electromechanical Systems) vibrator element having piezoelectric body arranged on a semiconductor substrate made of silicon or the like.

What is claimed is:

1. A vibrator device comprising:
   a vibrator element having a base part, and a plurality of vibrating arms extending along a first direction from the base part;
   a base body; and
   a support substrate configured to support the vibrator element with respect to the base body, wherein
   the support substrate includes
      a base-body fixation part to be fixed to the base body,
      an element support part configured to support the base part of the vibrator element, and
      a beam part configured to couple the base-body fixation part and the element support part to each other,
   the support substrate has a plurality of recessed parts in a surface facing the vibrator element,
   each of the plurality of recessed parts partially overlaps with each of the plurality of vibrating arms, respectively, in a plan view, and the support substrate, in which each of the plurality of recessed parts is formed, has a first thickness,
   an intermediate part of the support substrate between two adjacent recessed parts of the plurality of recessed parts has a second thickness, and
   the first thickness is smaller than the second thickness.

2. The vibrator device according to claim 1, wherein each of the plurality of recessed parts overlaps with each tip portion of the plurality of vibrating arms, respectively, in the plan view.

3. The vibrator device according to claim 1, wherein each of a first inner side surface and a second inner side surface of each of the plurality of recessed parts opposed to each other along a second direction crossing the first direction has a tilted surface, and
   a distance along the second direction between the first and second inner side surfaces decreases toward a bottom surface of each of the plurality of recessed parts.

4. The vibrator device according to claim 1, wherein the plurality of vibrating arms includes a first vibrating arm and a second vibrating arm, and the second vibrating arm is arranged side by side with the first vibrating arm along a second direction crossing the first direction,
   the second vibrating arm is arranged farther from the element support part than the first vibrating arm,
   the plurality of recessed parts has a first recessed part arranged so as to be opposed to the first vibrating arm, and a second recessed part arranged so as to be opposed to the second vibrating arm, and $Wa2-Wb2>Wa1-Wb1$ is fulfilled, where a width along the second direction of the first vibrating arm is defined as $Wb1$, a width along the second direction of the second vibrating arm is defined as $Wb2$, a width along the second direction of the first recessed part is defined as $Wa1$, and a width along the second direction of the second recessed part is defined as $Wa2$.

5. The vibrator device according to claim 1, wherein the plurality of vibrating arms includes a first vibrating arm and a second vibrating arm, the second vibrating arm is arranged side by side with the first vibrating arm along a second direction crossing the first direction, the second vibrating arm is arranged farther from the element support part than the first vibrating arm, the plurality of recessed parts has a first recessed part arranged so as to be opposed to the first vibrating arm, and a second recessed part arranged so as to be opposed to the second vibrating arm, the first recessed part has a third inner side surface located closer to the base part along the first direction than a tip portion of the first vibrating arm, the second recessed part has a fourth inner side surface located closer to the base part along the first direction than a tip portion of the second vibrating arm, and $Lc2>Lc1$ is fulfilled, where a first distance along the first direction between the tip portion of the first vibrating arm and the third inner side surface is defined as $Lc1$, and a second distance along the first direction between the tip portion of the second vibrating arm and the fourth inner side surface is defined as $Lc2$.

6. The vibrator device according to claim 4, wherein the first recessed part has a third inner side surface located closer to the base part along the first direction than a tip portion of the first vibrating arm, the second recessed part has a fourth inner side surface located closer to the base part along the first direction than a tip portion of the second vibrating arm, and $Lc2>Lc1$ is fulfilled, where a first distance along the first direction between the tip portion of the first vibrating arm and the third inner side surface is defined as $Lc1$, and a second distance along the first direction between the tip portion of the second vibrating arm and the fourth inner side surface is defined as $Lc2$.

7. The vibrator device according to claim 1, wherein defining a direction perpendicular to the first direction and a second direction as a third direction, the vibrator element and the support substrate are arranged so as to overlap each other in the third direction, and the vibrator element includes a pair of detection arms, as the plurality of vibrating arms, extending toward both sides in the first direction from the base part, the pair of detection arms being fixed to the element support part via a bonding member, a pair of coupling arms extending toward both sides in the second direction from the base part, a pair of first drive arms, as the plurality of vibrating arms, extending toward both sides in the first direction from a tip portion of one of the pair of coupling arms, and a pair of second drive arms, as the plurality of vibrating arms, extending toward the both sides in the first direction from a tip portion of another of the pair of coupling arms.

* * * * *